(12) United States Patent
Inoue et al.

(10) Patent No.: US 10,275,165 B2
(45) Date of Patent: Apr. 30, 2019

(54) MEMORY CONTROLLER

(71) Applicant: Toshiba Memory Corporation, Minato-ku, Tokyo (JP)

(72) Inventors: Kazuki Inoue, Kawasaki Kanagawa (JP); Sho Kodama, Kawasaki Kanagawa (JP); Keiri Nakanishi, Kawasaki Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 99 days.

(21) Appl. No.: 15/448,967

(22) Filed: Mar. 3, 2017

(65) Prior Publication Data

US 2018/0074730 A1 Mar. 15, 2018

Related U.S. Application Data

(60) Provisional application No. 62/393,194, filed on Sep. 12, 2016.

(51) Int. Cl.
| | |
|---|---|
| *G06F 11/00* | (2006.01) |
| *G06F 3/06* | (2006.01) |
| *G06F 11/10* | (2006.01) |
| *G11C 29/52* | (2006.01) |
| *H03M 13/35* | (2006.01) |
| *H03M 13/00* | (2006.01) |
| *G11C 11/56* | (2006.01) |
| *G11C 16/04* | (2006.01) |
| *G11C 16/10* | (2006.01) |

(Continued)

(52) U.S. Cl.
CPC ............ *G06F 3/0619* (2013.01); *G06F 3/064* (2013.01); *G06F 3/0656* (2013.01); *G06F 3/0679* (2013.01); *G06F 11/1068* (2013.01); *G11C 29/52* (2013.01); *H03M 13/356* (2013.01); *H03M 13/6318* (2013.01); *G11C 11/5628* (2013.01); *G11C 11/5642* (2013.01); *G11C 16/0483* (2013.01); *G11C 16/10* (2013.01); *G11C 16/26* (2013.01); *G11C 2029/0411* (2013.01); *G11C 2029/4402* (2013.01)

(58) Field of Classification Search
None
See application file for complete search history.

(56) References Cited

U.S. PATENT DOCUMENTS

| | | | | |
|---|---|---|---|---|
| 8,239,735 B2 * | 8/2012 | Shalvi | ................. | G11C 16/349 714/774 |
| 2007/0136623 A1 * | 6/2007 | Perego | ............. | G01R 31/31709 714/704 |

(Continued)

FOREIGN PATENT DOCUMENTS

| | | |
|---|---|---|
| JP | 2008-192240 A | 8/2008 |
| JP | 2009-537055 A | 10/2009 |

(Continued)

*Primary Examiner* — Daniel F. McMahon
(74) *Attorney, Agent, or Firm* — White & Case LLP

(57) ABSTRACT

According to one embodiment, a control unit determines a first physical sector in which first data is to be written among a plurality of physical sectors based on first information that is based on a result of the first data translation and the device characteristics of the plurality of physical sectors. A write unit writes data for which a first data translation is performed into the first physical sector of a nonvolatile memory.

18 Claims, 20 Drawing Sheets

(51) Int. Cl.
*G11C 16/26* (2006.01)
*G11C 29/04* (2006.01)
*G11C 29/44* (2006.01)

(56) References Cited

U.S. PATENT DOCUMENTS

| | | | |
|---|---|---|---|
| 2010/0088464 A1* | 4/2010 | Yang | G06F 12/0246 |
| | | | 711/103 |
| 2013/0073895 A1 | 3/2013 | Cohen | |
| 2014/0075098 A1* | 3/2014 | Uno | G06F 12/0246 |
| | | | 711/103 |
| 2014/0101514 A1* | 4/2014 | Cho | G06F 11/1012 |
| | | | 714/758 |
| 2017/0262194 A1* | 9/2017 | Kodama | G06F 3/0616 |
| 2017/0364298 A1* | 12/2017 | Choi | G06F 3/0619 |

FOREIGN PATENT DOCUMENTS

| | | |
|---|---|---|
| JP | 2014-507717 A | 3/2014 |
| JP | 2014-167790 A | 9/2014 |

\* cited by examiner

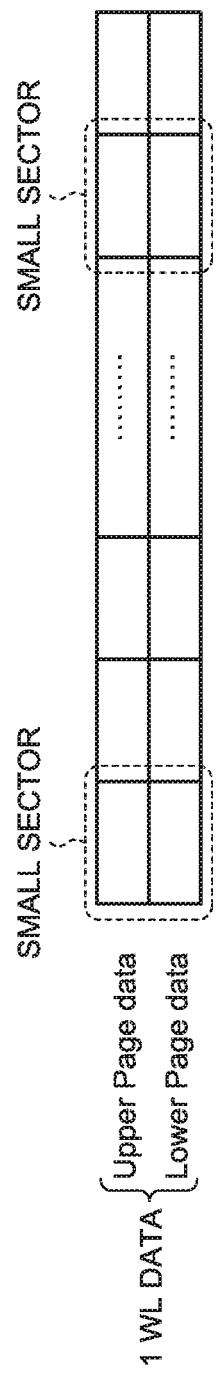

FIG.5A

NO FLIPPING

| DISTRIBUTION / Page | E | A | B | C | FLAG |
|---|---|---|---|---|---|
| Upper | 1 | 0 | 0 | 1 | 0 |
| Lower | 1 | 1 | 0 | 0 | 0 |

FIG.5B

FLIP LOWER PAGE DATA

| Upper | 1 | 0 | 0 | 1 | 0 |
|---|---|---|---|---|---|
| Lower | 0 | 0 | 1 | 1 | 1 |

FIG.5C

FLIP UPPER PAGE DATA

| Upper | 0 | 1 | 1 | 0 | 1 |
|---|---|---|---|---|---|
| Lower | 1 | 1 | 0 | 0 | 0 |

FIG.5D

FLIP LOWER PAGE AND UPPER PAGE DATA

| Upper | 0 | 1 | 1 | 0 | 1 |
|---|---|---|---|---|---|
| Lower | 0 | 0 | 1 | 1 | 1 |

FIG.6

| PHYSICAL SECTOR ADDRESS | DEVICE CHARACTERISTIC |
|---|---|
| ADDRESS K | |
| ⋮ | ⋮ |
| ADDRESS L | |

MEMORY CONTROLLER

CROSS-REFERENCE TO RELATED APPLICATIONS

This application is based upon and claims the benefit of priority from U.S. Provisional Application No. 62/393,194, filed on Sep. 12, 2016; the entire contents of which are incorporated herein by reference.

FIELD

Embodiments described herein relate generally to a memory controller including a nonvolatile memory.

BACKGROUND

Data having a high rewriting frequency is written into a block belonging to a group that has a low bit error rate. Alternatively, data having a low rewriting frequency is written into a block that belongs to a group having a high bit error rate.

BRIEF DESCRIPTION OF THE DRAWINGS

FIG. 4 is a diagram that illustrates a relation between one word line data and a small sector;

FIGS. 5A to 5D are diagrams that illustrate data coding corresponding to four data translations;

FIG. 6 is a diagram that illustrates a device characteristic table;

DETAILED DESCRIPTION

In general, according to one embodiment, a memory controller controls a nonvolatile memory. The nonvolatile memory includes a plurality of physical sectors. Each of the plurality of physical sectors includes memory cells. The memory controller includes: a compression unit; data translating unit; a control unit; and a write unit. The compression unit compresses first data. The data translating unit performs a first data translation for the compressed first data. The control unit determines a first physical sector in which the first data for which the first data translation is performed is to be written among the plurality of physical sectors based on first information. The first information is based on a result of the first data translation and device characteristics of the plurality of the physical sectors. The write unit writes data for which the first data translation is performed into the first physical sector of the nonvolatile memory.

Exemplary embodiments of a memory controller, a method of controlling a nonvolatile memory, and a memory system will be described below in detail with reference to the accompanying drawings. The present invention is not limited to such embodiments.

First Embodiment

Figure 1:
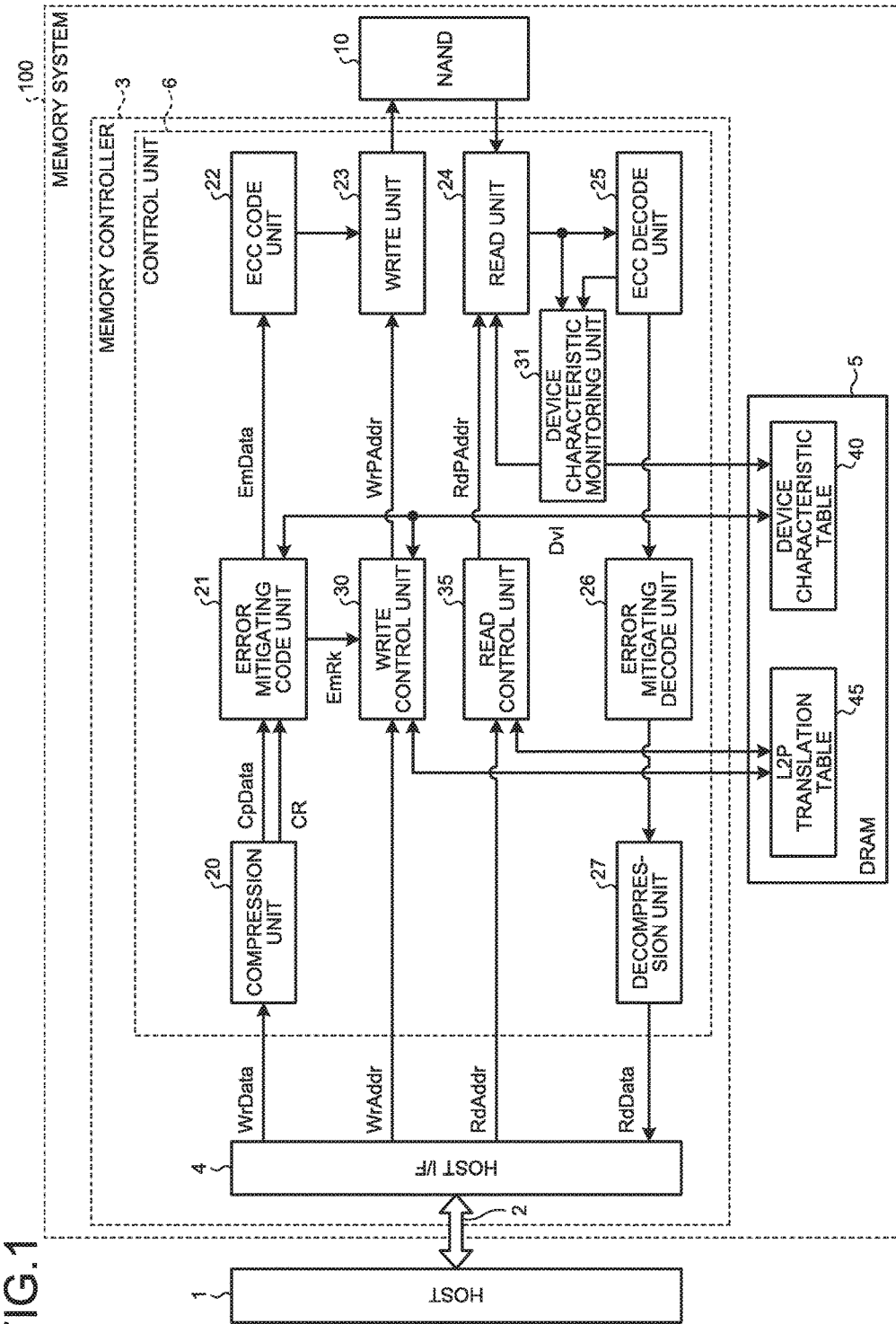
FIG. 1 is a functional block diagram that illustrates an example of the internal configuration of a memory system according to a first embodiment.

FIG. 1 is a block diagram that illustrates an example of the configuration of a memory system 100 according to a first embodiment. The memory system 100 is connected to a host apparatus 1 (hereinafter, abbreviated to a host) through a communication line 2 and functions as an external storage device of the host 1. The host 1, for example, may be an information processing apparatus such as a personal computer, a mobile phone, or an imaging apparatus or a mobile terminal such as a tablet computer or a smartphone.

The memory system 100 includes: a NAND flash memory (hereinafter, abbreviated to a NAND) 10 as a nonvolatile memory; a dynamic random access memory (DRAM) 5; and a memory controller 3. The memory controller 3 includes: a host interface 4; and a control unit 6. The nonvolatile memory is not limited to the NAND flash memory but may be a flash memory having a three-dimensional structure, a resistance random access memory (ReRAM), a ferroelectric random access memory (FeRAM), or the like.

The NAND 10 includes one or more memory chips each including a memory cell array. The memory cell array includes a plurality of memory cells (hereinafter, referred to as cells) arranged in a matrix pattern. The memory cell array includes a plurality of blocks that are units for data erasing. Each block is configured by a plurality of physical sectors MS (see FIG. 2). The memory cell array is not particularly limited to a specific configuration but may be a memory cell array having a two-dimensional structure, a memory cell array having a three-dimensional structure, or a memory cell array having any other structure.

Figure 2:
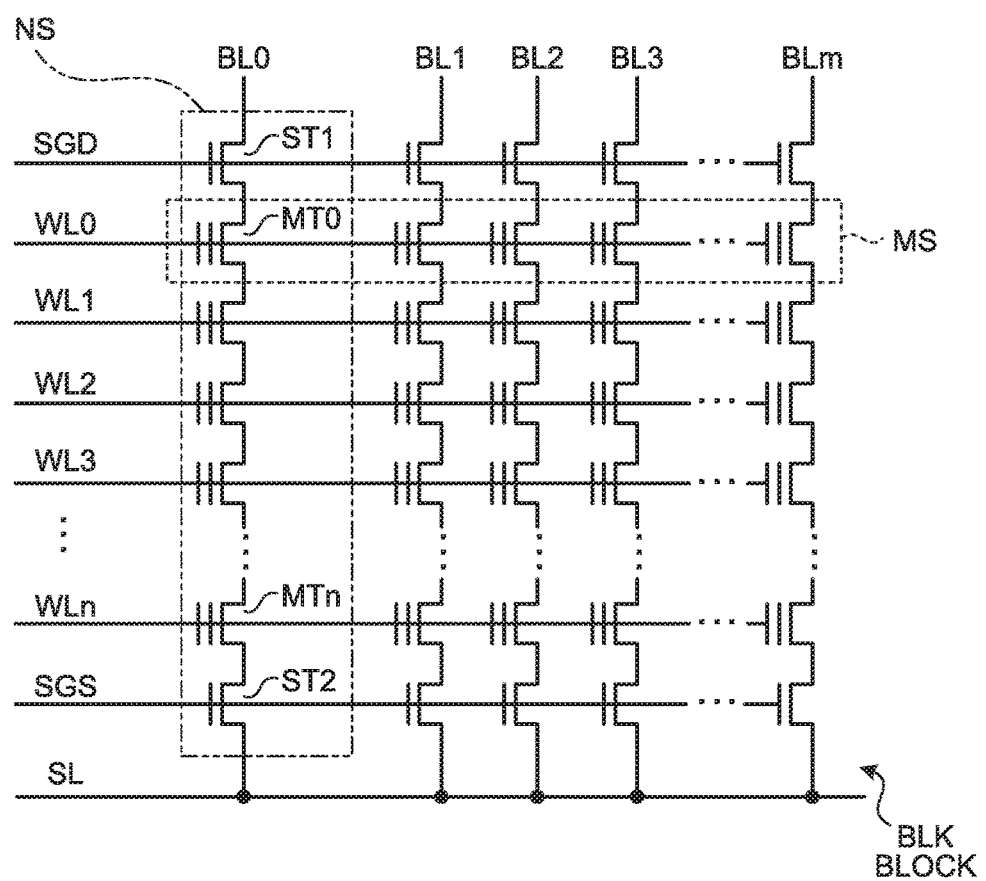
FIG. 2 is a diagram that illustrates an example of the circuit configuration of a memory cell array.

FIG. 2 is a diagram that illustrates an example of the configuration of a block of the memory cell array having a two-dimensional structure. FIG. 2 illustrates one of a plurality of blocks that configure the memory cell array having the two-dimensional structure. The other blocks have the same configuration as that illustrated in FIG. 2. The block BLK of the memory cell array includes (m+1) (here, m is an integer of "0" or more) NAND strings NS. Each NAND string NS includes: (n+1) (here, n is an integer of zero or more) cell transistors MT0 to MTn connected in series to share a diffusion area (a source region or a drain region) between cell transistors MT adjacent to each other; and selection transistors ST1 and ST2 arranged at both ends of the column of the cell transistors MT0 to MTn.

Word lines WL0 to WLn are respectively connected to control gate electrodes of the cell transistors MT0 to MTn. In addition, cell transistors MTi (here, i=0 to n) are connected to be common using the same word line WLi (here, i=0 to n). In other words, the control gate electrodes of the cell transistors MTi disposed in the same row within the block BLK are connected to the same word line WLi.

Each of the cell transistors MT0 to MTn is configured by a field effect transistor having a stacked gate structure on a semiconductor substrate. Here, the stacked gate structure includes: a charge storage layer (floating gate electrode) formed on the semiconductor substrate with a gate insulating film being interposed therebetween; and a control gate electrode formed on the charge storage layer with an intergate insulating film being interposed therebetween. A threshold voltage of each of the cell transistors MT0 to MTn changes according to the number of electrons storable in the floating gate electrode and thus, can store data according to a difference in the threshold voltage.

Bit lines BL0 to BLm are respectively connected to the drains of (m+1) selection transistors ST1 within one block BLK, and a selection gate line SGD is connected to be common to the gates of the selection transistors. In addition, the source of the selection transistor ST1 is connected to the drain of the cell transistor MT0. Similarly, a source line SL is connected to be common to the sources of the (m+1) selection transistors ST2 within one block BLK, and a selection gate line SGS is connected to be common to the gates of the selection transistors. In addition, the drain of the selection transistor ST2 is connected to the source of the cell transistor MTn.

Each cell is connected not only to the word line but also to the bit line. Each cell can be identified by using an address used for identifying a word line and an address used for identifying a bit line. The data of cells (the cell transistors MT) disposed within the same block BLK is erased altogether. On the other hand, data is written and read in units of physical sectors MS. One physical sector MS includes a plurality of cells connected to one word line.

Each cell can perform multi-value storage. In a case where the cells are operated in a single level cell (SLC) mode, one physical sector MS corresponds to one page. On the other hand, in a case where the cells are operated in a multiple level cell (MLC) mode, one physical sector MS corresponds to two pages. In a case where the cells are operated in a triple level cell (TLC) mode, one physical sector MS corresponds to three pages. In a case where the cells are operated in a quadruple level cell (QLC) mode, one physical sector MS corresponds to four pages.

In a read operation and a program operation, one-word line is selected according to the physical address, and one physical sector MS is selected. A translation into a page within this physical sector MS is performed using the physical address.

User data transmitted from the host 1, management information used for managing the user data, and the like are stored In the NAND 10. The management information includes a logical/physical translation table (L2P translation table), a device characteristic table, and the like.

The management information including a device characteristic table 40 and a L2P translation table 45 stored in the NAND 10 is loaded into the DRAM 5 at the time of start-up or the like. The management information loaded into the DRAM 5 is backed up using the NAND 10.

The memory controller 3 includes: the host interface 4; and the control unit 6. The DRAM 5 may be disposed inside the memory controller 3. The host I/F 4 performs a process according to the specification of an interface with the host 1 and outputs a command, user data (write data), and the like received from the host 1 to the control unit 6. In addition, the host I/F 4 transmits user data read from the NAND 10, a response from the control unit 6, and the like to the host 1.

The memory system 100 receives a write request and a read request from the host 1. The write request includes a write command, a write address WrAddr, and write data WrData. The read request includes a read command and a read address RdAddr. In a case where a write request is received, the host I/F 4 inputs the write command, the write address WrAddr, and the write data WrData to the control unit 6. The control unit 6 translates the write address WrAddr that is a logical address into a physical address WrPAddr of the NAND 10 and writes the write data WrData to the translated physical address WrPAddr. In a case where a read request is received, the host I/F 4 inputs the read command and the read address RdAddr to the control unit 6. The control unit 6 translates the read address RdAddr that is a logical address into a physical address RdPAddr of the NAND 10 and reads data from the translated physical address RdPAddr. The control unit 6 transmits the read data to the host 1 through the host I/F 4.

The control unit 6 manages user data by using the L2P table 45 loaded in the DRAM 5. In the L2P table 45, mapping that associates a logical address WrAddr that can be designated by the host 1 and a physical address Addr of the NAND 10 is registered. As the logical address, for example, logical block addressing (LBA) is used. The physical address Addr represents a storage position on the NAND 10 in which data is stored.

The control unit 6 performs management of blocks included in the NAND 10 by using a block management table (not illustrated in the drawing) that is one of the management information described above. The block management table, for example, manages the following block management information.

A number of times of erasing in units of blocks (erase count)

Information used for identifying whether a block is an active block or a free block Block Address of a Bad Block In an active block, valid data is recorded. In a free block, valid data valid data is not recorded. The free block can be reused as an erased block after erasing data thereof. The valid data is data associated with a logical address, and invalid data is data with which a logical address is not associated. When data is written into an erased block, the erased block becomes an active block. A bad block is an unusable block that does not normally operate due to various factors.

The control unit 6 includes: a compression unit 20; an error mitigating code unit 21; an ECC code unit 22; a write unit 23; a read unit 24; an ECC decode unit 25; an error mitigating decode unit 26; a decompression unit 27; a write control unit 30; and a read control unit 35. The function of each constituent element configuring the control unit 6, for example, is realized by one or a plurality of CPUs (processors) executing firmware loaded into the DRAM 5 and a peripheral circuit.

Figure 3:
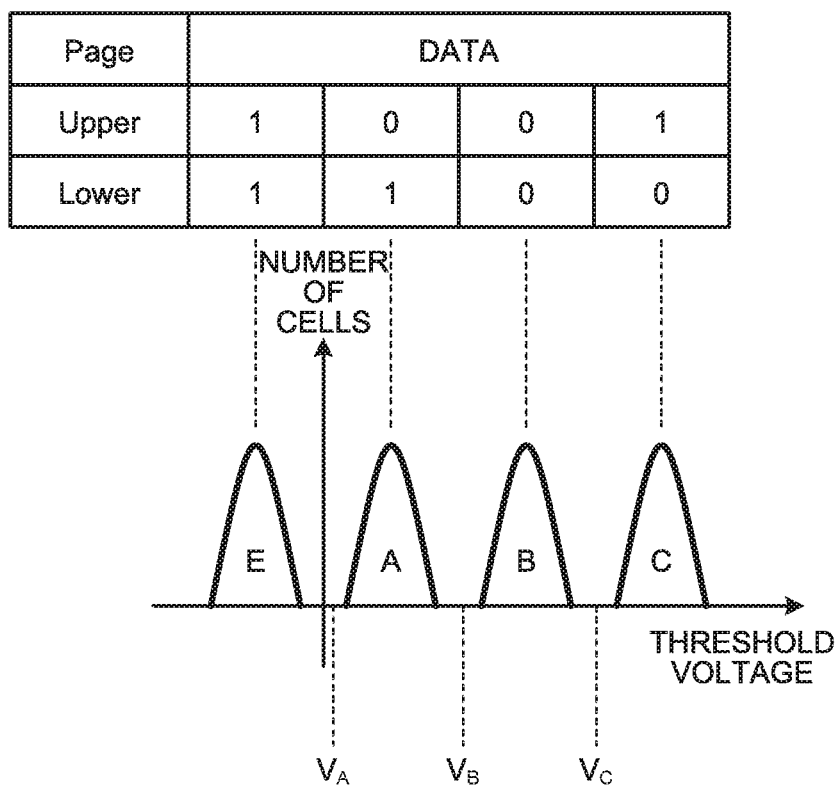
FIG. 3 is a diagram that illustrates an example of a threshold voltage distribution and data coding of a memory cell of 2 bits/cell.

FIG. 3 is a diagram that illustrates an example of threshold voltage distributions and data coding of memory cells of two bits/cell operating in the MLC mode. In a lower diagram illustrated in FIG. 3, the horizontal axis represents the threshold voltage, and the vertical axis represents the number of cells. In the case of memory cells that are two-bit cells, four distributions B, A, B, and C are included. The distribution E has a lowest threshold voltage and corresponds to a threshold voltage distribution of an erased state. The threshold voltage is higher in order of the distributions A, B, and C. Thus, the distribution C has a highest threshold voltage. Data values of two bits are associated with each of the distributions B, A, B, and C. Such association is called data coding. The data coding is set in advance. At the time of writing (programming) data, electric charge is injected into cells such that a threshold voltage distribution corresponding to a stored data value is formed in accordance with data coding. One physical sector corresponds to two pages. In this embodiment, these two pages will be referred to as a lower page and an upper page.

In FIG. 3, an upper diagram is a diagram that illustrates an example of data coding. The distribution E corresponds to a data value of "11", the distribution A corresponds to a data value of "01", the distribution B corresponds to a data value of "00", and the distribution C corresponds to a data value of "10". In this embodiment, when data of the upper page is denoted by Du, and data of the lower page is denoted by Dl, the data value of two bits will be denoted as "DuDl". The data coding is not limited to the example illustrated in FIG. 3. A reading voltage VA is set between the distribution E and the distribution A, a reading voltage VB is set between the distribution A and the distribution B, and a reading voltage VC is set between the distribution B and the distribution C. Here, VB is a reading voltage used for determining the data value of the lower page, and VA and VC are reading voltages used for determining the data value of the upper page.

A flash memory has such a characteristic that, as the amount of electric charge injected to cells increases, the degree of fatigue of the cells increases, and the endurance is degraded. Accordingly, in the case of the SLC mode, the endurance of cells is degraded more for a logical value "0" (after injection of electric charge) than for a logical value "1" (erased state). In the case of the MLC mode (two bits/cell), for a distribution C having a highest threshold voltage, the degree of fatigue of cells is highest. Such a characteristic will be referred to as a first characteristic.

In addition, in the flash memory, there are cases where an incorrect data value is read at the time of reading due to inter-cell interferences. In a case where the threshold voltage levels of adjacent cells are equal to maximum-minimum-maximum or minimum-maximum-minimum, the influence is strong. In the case of two bits/cell, in a case where the threshold voltage levels are equal to distribution C-distribution F-distribution C (hereinafter, abbreviated to C-E-C) or distribution E-distribution C-distribution F (hereinafter, abbreviated to E-C-E), the influence is strong. Such a characteristic will be referred to as a second characteristic.

In order to alleviate or prevent the influences according to the first characteristic and/or the second characteristic, a compression process performed by the compression unit 20 and an error mitigating code process performed by the error mitigating code unit 21 are performed.

FIG. 4 is a diagram that illustrates the management unit of a data process performed by the error mitigating code unit 21. Data of N pages stored in one physical sector MS will be referred to as word line data (hereinafter, abbreviated to WL data). In the case of two bits/cell, one WL data includes lower page data and upper page data. The one WL data is divided into a plurality of small sectors having a certain data length. In other words, one physical sector MS includes a plurality of small sectors. Data of one small sector length is the unit of the data process performed by the error mitigating code unit 21.

The compression unit 20 performs lossless compression of write data WrData input from the host I/F 4, thereby generating compression data CpData. According to the compression, the number of bits of the write data WrData is decreased. While a technique used for the compression is arbitrary, a technique enabling lossless compression is employed. The compression unit 20 may compress the write data WrData for each small sector length described above or be compressed for each one page data. When the compression of the write data WrData is completed, the compression unit 20 calculates a compression rate CR. The compression rate CR, for example, is represented as a percentage of the data length of the compression data CpData to the data length of the input write data WrData. The compression data CpData and the compression rate CR are input to the error mitigating code unit 21.

The error mitigating code unit 21 performs an error mitigating code process for the compression data CpData and inputs processed data EmData to the ECC code unit 22. The error mitigating code process may be performed in units of the small sector data including the lower page data and the upper page data. Alternatively, the error mitigating code process may be performed in units of the lower page data having the small sector length and be performed in units of the upper page data having the small sector length. Alternatively, the error mitigating code process may be performed for each one page data or be performed for each one WL data.

The error mitigating code unit 21, based on at least the data EmData for which the error mitigating code process has been performed, inputs error mitigation capability information EmRk of data EmData generated for each one WL data to the write control unit 30. The capability information EmRk represents an error mitigation capability for the first characteristic and/or the second characteristic. The capability information EmRk may be classified into a plurality of ranks including at least two ranks in a case where the capability information is classified into three ranks, a lowest rank, a middle rank, and a highest rank are included.

As the error mitigating code process, one of first to third processes as below is performed. The first process includes a padding process of adding padding data to the compression data CpData. The second process includes a logical operation process of performing a certain logical operation for the compression data CpData. The third process includes the padding process described above and the logical operation process described above.

The first process described above will now be described. The error mitigating code unit 21 adds padding data corresponding to a data length decreased according to the compression rate CR to the compression data CpData. The error mitigating code unit 21 may be configured to add the padding data to the compression data CpData in a distributed manner or add the padding data to one position in a concentrated manner. The padding data and/or the insertion position of the padding data are determined such that the influences according to the first characteristic and/or the second characteristic are relieved. In other words, padding data to each page and the insertion position of the padding data are determined such that the number of distributions having a highest threshold voltage is minimum or the number of C-E-C or E-C-E is minimum. In addition, the first process may be performed in units of small sectors or be performed for each page data. In the case of the first process, the capability information EmRk in units of one WL data is determined based on the compression rate CR in units of one WL data and the result of the padding process in units of one WL data. In the case of the first process, as the compression rate CR is higher, more padding data can be added, the effect of the error mitigating code process increases, and the capability information EmRk can be ranked higher. In addition, as the number of distributions C included in the data EmData is smaller, and, as the number of distributions E is larger, the capability information EmRk of a higher rank for the first characteristic is included. In addition, as the number of patterns C-E-C or E-C-E included in the data EmData is smaller, the capability information EmRk of a higher rank for the second characteristic is included. Further, the error mitigating code unit 21 may determine the capability information EmRk based on the compression rate CR and the compression data CpData.

The second process described above will be described. The error mitigating code unit 21 performs a logical operation of the compression data CpData with a predetermined bit pattern. In addition, the error mitigating code unit 21 adds a flag FG representing an execution content of the logical operation to an execution result of the logical operation. As the logical operation, for example, a flipping process of inverting input data or an exclusive OR operation with a certain bit pattern is employed. The flipping process is equal to executing an exclusive OR operation of input data and a bit pattern having all the bits of "1". The error mitigating code unit 21, for example, generates four data translation candidates. Four data translations include: a first data translation not performing a flipping process for input data; a second data translation performing a flipping process only for the lower page data of the input data; a third data translation performing a flipping process only for the upper page data of the input data; and a fourth data translation performing a flipping process for the lower page data and the upper page data of the input data.

FIGS. 5A to 5D are diagrams that illustrate data coding corresponding to the four data translations performed by the error mitigating code unit 21. On the right side in FIGS. 5A to 5D, flags FG added at the time of performing the data translations are illustrated. FIG. 5A illustrates threshold voltage distributions B, A, B, and C of a memory cell of 2 bits/cell and data coding at the time of not performing a data translation, in other words, not performing flipping, and the flag FG is "00". FIG. 5B illustrates data coding at the time of flipping only the lower page data, and the flag FG is "01". FIG. 5C illustrates data coding at the time of flipping only the upper page data, and the flag FG is "10". FIG. 5D illustrates data coding at the time of flipping the upper page data and the lower page data, and the flag FG is "11".

In the case illustrated in FIG. 5B, compared to the case illustrated in FIG. 5A, the distributions E and C are interchanged, and the distributions A and B are interchanged. In the case illustrated in FIG. 5C, compared to the case illustrated in FIG. 5A, the distributions E and A are interchanged, and the distributions B and C are interchanged. In the case illustrated in FIG. 5D, compared to the case illustrated in FIG. 5A, the distributions E and B are interchanged, and the distributions A and C are interchanged.

The error mitigating code unit 21, for example, generates the four data translation candidates for each small sector data. The error mitigating code unit 21 selects one data translation candidate for which the effects of the first characteristic and/or the second characteristic are relieved most from among the four data translation candidates. The error mitigating code unit 21 adds a flag FG representing the content of the data translation to the selected translation candidate. In the case of the second process, the capability information EmRk in units of one WL data is determined based on at least the result of the second process in units of one WL data.

In the case of the second process, as the data length of the small sector data is shorter, in other words, as the number of divisions from one WL data into small sector data is larger, the effect of relieving the effects according to the first characteristic and/or the second characteristic increases. As the number of divisions is increased, the number of bits required for the flag FG increases. Thus, the error mitigating code unit 21 may perform control for changing the number of divisions, in other words, the data length of the small sector data in accordance with the compression rate CR. In other words, when the compression rate CR is high, the effect of the error mitigating code process is increased by increasing the number of divisions, and thus, the capability information EmRk can be ranked higher. In a case where this control is performed, the capability information EmRk in units of one WL data is determined based on the compression rate CR in units of one WL data and the result of the second process in units of one WL data.

The third process will now be described. The third process includes the padding process and the logical operation process. The error mitigating code unit 21 inserts padding data of which the number of bits corresponds to the compression rate CR to the compression data CpData. The error mitigating code unit 21 generates four data translation candidates by performing the flipping process described above for the data to which the padding data has been added. The error mitigating code unit 21 selects one data translation candidate for which the effects according to the first characteristic and/or the second characteristic are relieved from among the four data translation candidates. The error mitigating code unit 21 adds a flag FG representing the content of a data translation to the selected translation candidate. In the case of the third process, the capability information EmRk in units of one WL data is determined based on the compression rate CR in units of one WL data and the result of the third process in units of one WL data. In the case of the third process, as the compression rate CR is higher, more padding data is added, and accordingly, the effect of the error mitigating code process is increased. Even in the case of the third process, the error mitigating code unit 21 may perform control for changing the number of divisions, in other words, the data length of the small sector data in accordance with the compression rate CR. In the case of the third process, the error mitigating code unit 21 may determine the capability information EmRk based on the compression rate CR, the compression data CpData, and the processed data EmData.

The ECC code unit 22 performs an error correction coding process for the data EmData, thereby generating parity. The ECC code unit 22 inputs a code word including the data and the parity to the write unit 23. The write unit 23 outputs the code word to the NAND 10 together with a write physical address WrPAddr input from the write control unit 30, thereby writing the code word into the NAND 10.

The read unit 29, by outputting the read physical address RdPAddr input from the read control unit 35 to the NAND 10, reads a code word from a page of the NAND 10 that corresponds to the read physical address RdPAddr. The read unit 29 inputs the read code word to the ECC decode unit 25. The ECC decode unit 25 performs an error correction decoding process by using the input code word and inputs the decoded data (read data) to the error mitigating decode unit 26.

The error mitigating decode unit 26 performs an inverse translation of the coding process performed by the error mitigating code unit 21. In a case where the coding process is the first process (padding process), the error mitigating decode unit 26 removes padding data from read data. On the other hand, in a case where the coding process is the second process (flipping process), the error mitigating decode unit 26 performs an inverse translation process (inverse flipping process) of the read data based on the flag FG included in the read data. In other words, the error mitigating decode unit 26 determines whether the flag FG is "0" or "1", thereby determining whether the translation process (flipping process) has been performed for the read data. In a case where the flag FG represents that the translation process has been performed, the error mitigating decode unit 26 performs an inverse translation (flipping) of the read data. On the other hand, in a case where the flag FG represents that that translation process has not been performed, the error mitigating decode unit 26 does not perform the inverse translation of the read data. The error mitigating decode unit 26 removes the flag FG. In a case where the coding process is the third process (padding and flipping process), the error mitigating decode unit 26 performs removal of the padding data and the inverse translation (inverse flipping).

The decompression unit 27 decompresses data by performing a data translation in a direction opposite to that of the compression process performed by the compression unit 20, thereby restoring the data input from the error mitigating decode unit 26 to the original write data WrData. The restored write data WrData is output to the host I/F 4 as read data RdData. The decompression unit 27 performs a decompression process for the input data from a start bit and ends the decompression process when the data length becomes a length of the original write data corresponding to one page.

The write control unit 30 selects a physical sector that is a write destination based on the capability information EmRk and the device characteristic of each physical sector MS stored in the device characteristic table 40.

In a three-dimensionally mounted NAND flash memory, the device characteristics of physical sectors within a block are predicted to be different much. For this reason, in this embodiment, the data arrangement is optimized in units of physical sectors.

FIG. 6 is a diagram that illustrates an example of the device characteristic table 40. In the device characteristic table 40, for each physical sector MS, a device characteristic is registered. The device characteristic includes characteristics relating to the life and the reliability such as a characteristic representing the degree of wear or the endurance and an electric charge maintaining characteristic (data retention characteristic). As a parameter representing the degree of wear, for example, the number of programming or a bit error rate (BER) is used. The number of programming is a count value that is incremented by one each time when the physical sector MS is programmed and is counted for each physical sector MS. The BER is a value acquired by dividing the number of bits that have failed at the time of performing a decoding process of read data in the ECC decode unit 25 by the number of bits of the read data. In addition, as the data retention characteristic, a maintaining time for which a certain amount of electric charge can be maintained from a time point when data is written into a physical sector is set.

The device characteristic monitoring unit 31 updates the device characteristic registered in the device characteristic table 40. In a case where the number of programming is used as the device characteristic, the device characteristic monitoring unit 31 counts up the number of programming relating to a corresponding physical sector at the time of writing data. On the other hand, in a case where the BER is used as the device characteristic, the device characteristic monitoring unit 31, when read data of each page of the NAND 10 is decoded, acquires a bit error rate (BER) from the ECC decode unit 25 and updates the BER of each physical sector MS. Alternatively, during a period in which there is no access from the host 1, data stored in the NAND 10 is read in a certain unit each time, a BER is acquired from the ECC decode unit 25, and the BER of each physical sector MS is updated. In addition, in a case where the retention characteristic is used as the device characteristic, the device characteristic monitoring unit 31, during a period in which there is no access from the host 1, regularly reads all the data stored in the NAND 10 in a certain unit each time, measures a threshold voltage of each cell or a sample cells included in a physical sector, determines a status in which electric charge of each cell drops, and measures the retention characteristic of each cell based on this determination. The device characteristic monitoring unit 31, for example, registers an average of retention characteristics or a shortest retention characteristic of cells in the device characteristic table 40. The device characteristic of each physical sector is managed using the device characteristic monitoring unit 31 and the device characteristic table 40.

The device characteristic may be classified into a plurality of ranks including at least two ranks and be registered in the device characteristic table 40. In a case where the device characteristic is classified into three ranks, it is classified into a lowest rank, a middle rank, and a highest rank. The lowest rank corresponds to a lowest rank in a user data area of the NAND 10, and the highest rank corresponds to a highest rank in the user data area of the NAND 10. The user data area is an area in which write data WrData received from the host 1 is written among all the storage areas of the NAND 10.

When a write address WrAddr is translated into a physical address WrPAddr, the write control unit 30 refers to the capability information EmRk and device information registered in the device characteristic table 40. The write control unit 30 determines the physical address WrPAddr such that the data EmData is written in a physical sector having a device characteristic of a second rank in a case where the capability information EmRk of the data EmData is in a first rank, and the data EmData is written in a physical sector having a device characteristic of a fourth rank in a case where the capability information EmRk of the data EmData is in a third rank. The second rank has a lower rank than the first rank. The third rank has a lower rank than the first rank.

The fourth rank has a higher rank than the second rank. For example, the write control unit 30, based on the capability information EmRk and the device information, determines a physical address WrPAddr such that data having the capability information EmRk of a highest rank is written into a physical sector having a device characteristic of a lowest rank, or data having the capability information EmRk of a lowest rank is written into a physical sector having a device characteristic of a highest rank. In addition, data having the capability information EmRk of a rank other than the highest rank is written into a physical sector having a device characteristic of a rank other than the lowest rank.

For example, in a case where the capability information EmRk is classified into a high rank, a middle rank, and a low rank, and the device information is classified into a high rank, a middle rank, and a low rank, a physical address WrPAddr is determined such that data having the capability information EmRk of the high rank is written into a physical sector having the device characteristic of the low rank, and data having the capability information EmRk of the low rank is written into a physical sector having the device characteristic of the high rank. Accordingly, the reliability and the retention characteristic of data stored in each physical sector are averaged. In addition, while a refresh process in which data within a physical sector of which the BER is degraded to some degrees is moved to another physical sector is performed, the refresh occurrence frequency can be decreased through the averaging process described above. Accordingly, the number of writing/erasing is decreased, and the prolonged life of the memory system can be expected.

The write control unit 30 inputs the determined physical address WrPAddr to the write unit 23 and registers L2P information representing a correspondence between the write address WrAddr and the physical address WrPAddr in the L2P translation table 45.

When a read address RdAddr is input from the host I/F 4, the read control unit 35 inputs a physical address RdPAddr into which the read address RdAddr is translated using the L2P translation table 45 to the read unit 24.

Figure 7:
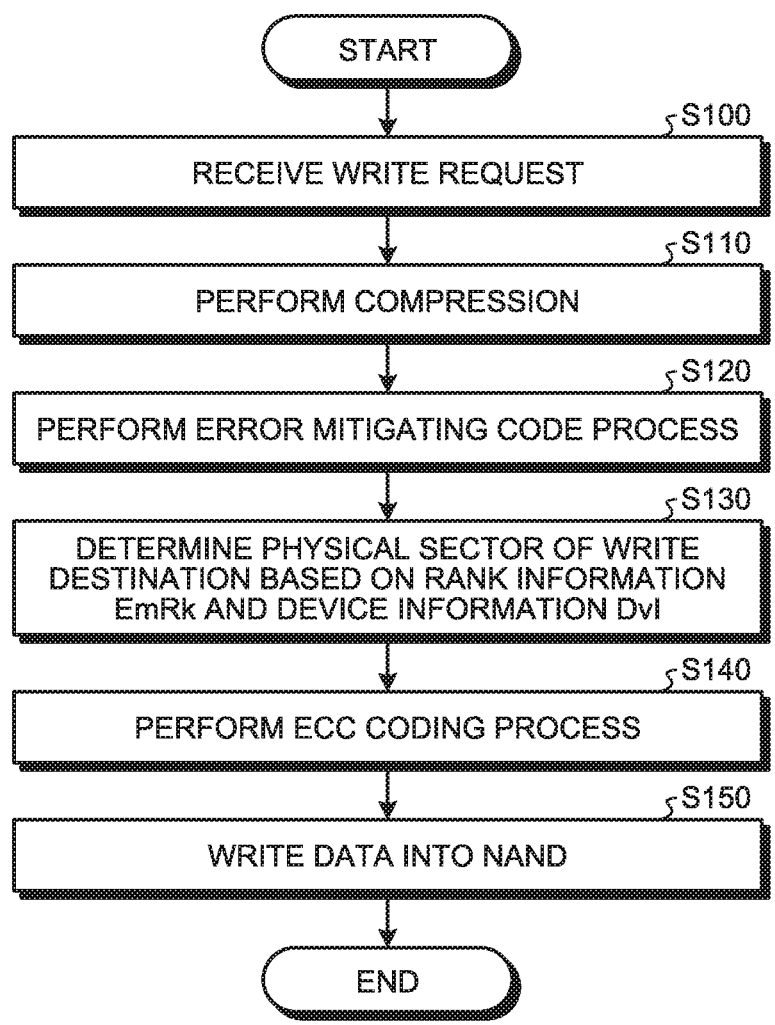
FIG. 7 is a flowchart that illustrates an example of the operation sequence of the memory system according to the first embodiment at the time of data writing.

Next, the operation sequence of the memory system 100 performed at the time of receiving a write request from the host 1 will be described with reference to a flowchart illustrated in FIG. 7. When a write request is received from the host 1 through the host I/F 4 (S100), the compression unit 20 compresses the write data WrData (S110) and outputs the compression data CpData and the compression rate CR to the error mitigating code unit 21. The error mitigating code unit 21 performs an error mitigating code process for the compression data CpData (S120) and outputs data EmData for which the error mitigating code process has been performed to the ECC code unit 22. In addition, the error mitigating code unit 21 outputs the capability information EmRk of the data EmData to the write control unit 30.

When the translation from the write address WrAddr to the physical address WrPAddr is performed, the write control unit 30 determines a physical address WrPAddr to which the write data is to be written based on the capability information EmRk and the device information (S130). The write control unit 30 selects a plurality of physical sectors as candidates for a write destination based on the device characteristic. In a case where the data EmData has the capability information EmRk of the high rank, the write control unit 30 selects a physical sector having the device characteristic of the low rank from among the plurality of selected physical sectors. On the other hand, in a case where the data EmData has the capability information EmRk of the low rank, the write control unit 30 selects a physical sector having the device characteristic of the high rank from among the plurality of selected physical sectors. The write control unit 30 inputs the determined physical address WrPAddr to the write unit 23 and registers the L2P information in the L2P translation table 45.

The ECC code unit 22 performs an error correction coding process for the data EmData (S140). The ECC code unit 22 inputs a code word including data and parity to the write unit 23. The write unit 23 outputs the code words to the NAND 10 together with the write physical address WrPAddr, and thus, writing the code word into the NAND 10 (S150).

Figure 8:
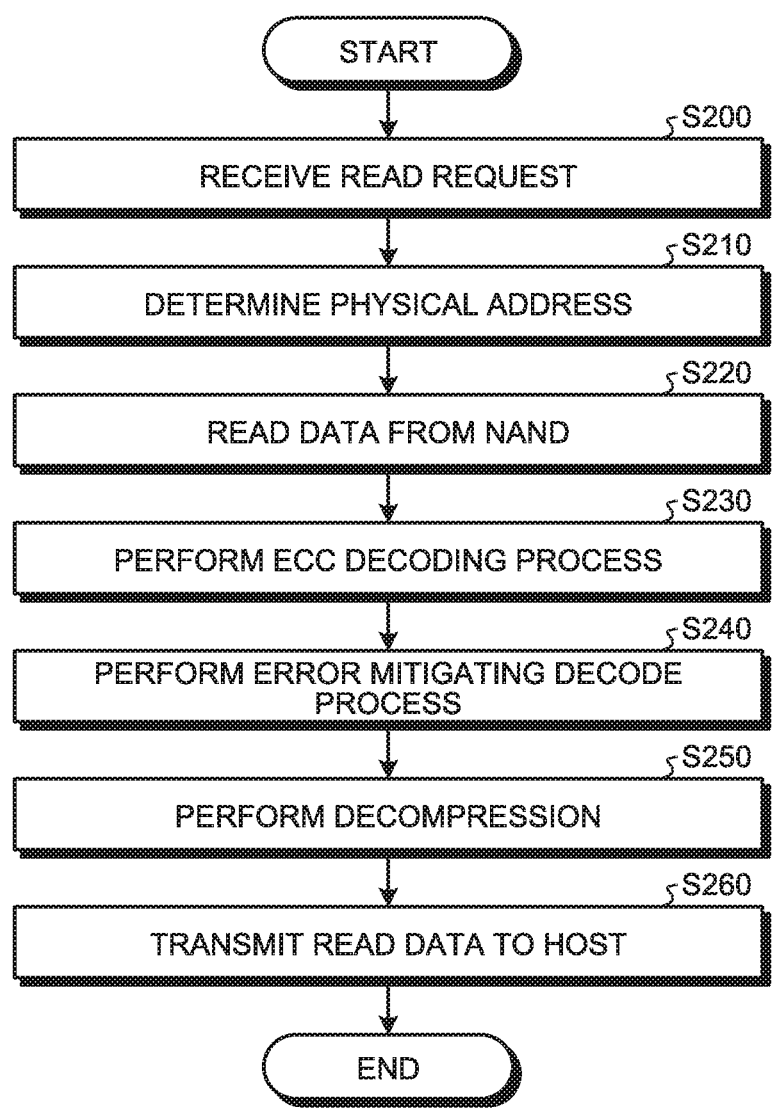
FIG. 8 is a flowchart that illustrates an example of the operation sequence of the memory system according to the first embodiment at the time of data reading.

Next, the operation sequence of the memory system 100 performed at the time of receiving a read request from the host 1 will be described with reference to a flowchart illustrated in FIG. 8. When a read request is received from the host 1 through the host I/F 4 (S200), the read control unit 35 translates the read address RdAddr into a physical address RdPAddr by using the L2P table 45 (S210) and outputs the translated physical address RdPAddr to the read unit 24. The read unit 24 reads a code word from a page of the NAND 10 that corresponds to the physical address RdPAddr (S220). The ECC decode unit 25 performs an error correction decoding process by using the read code word and inputs decoded data (read data) to the error mitigating decode unit 26.

The error mitigating decode unit 26 performs an inverse translation of the coding process performed by the error mitigating code unit 21 (S240). The error mitigating decode unit 26 inputs the inversely-translated data to the decompression unit 27. The decompression unit 27 decompresses data by performing a data translation in a direction opposite to that of the compression process performed by the compression unit 20 and restores the data input from the error mitigating decode unit 26 to the original write data WrData (S250). The decompression unit 27 outputs the restored data to the host I/F 4 as the read data RdData. The host I/F 4 transmits the read data RdData to the host 1 (S260).

In this way, according to the first embodiment, since data having an error mitigation capability that is appropriate to the device characteristic is written into each physical sector, the life and the reliability of the memory system can be improved.

In addition, the size for managing the device characteristic may be smaller than the physical sector. For example, the device characteristic may be managed in units of small sectors. In addition, the error mitigating code unit 21 may change the content of the coding process by referring to the device characteristic. For example, in a case where the characteristic such as the BER is degraded more at a corner of a physical sector than the center thereof, by configuring the size of a small sector applied to the corner of the physical sector to be smaller than a small sector applied to the center, the error mitigating code process may be controlled to effectively function for the corner of the physical sector. Alternatively, by adding more padding data to the corner than the center of the physical sector, the error mitigating code process may be controlled to effectively function for the corner of the physical sector.

In the first embodiment, the error mitigating code process may be performed in units of pages, and the device characteristic may be managed in units of pages. In this case, when page data for which the error mitigating code process has been performed has the capability information EmRk of the high rank, the write control unit 30 selects a page having the device characteristic of the low rank from among the plurality of pages as candidates for the write destination. When the page data for which the error mitigating code process has been performed has the capability information. EmRk of the low rank, the write control unit 30 selects a page having the device characteristic of the high rank from among the plurality of pages. Then, the page data for which the error mitigating code process has been performed is written to the selected page.

Second Embodiment

Figure 9:
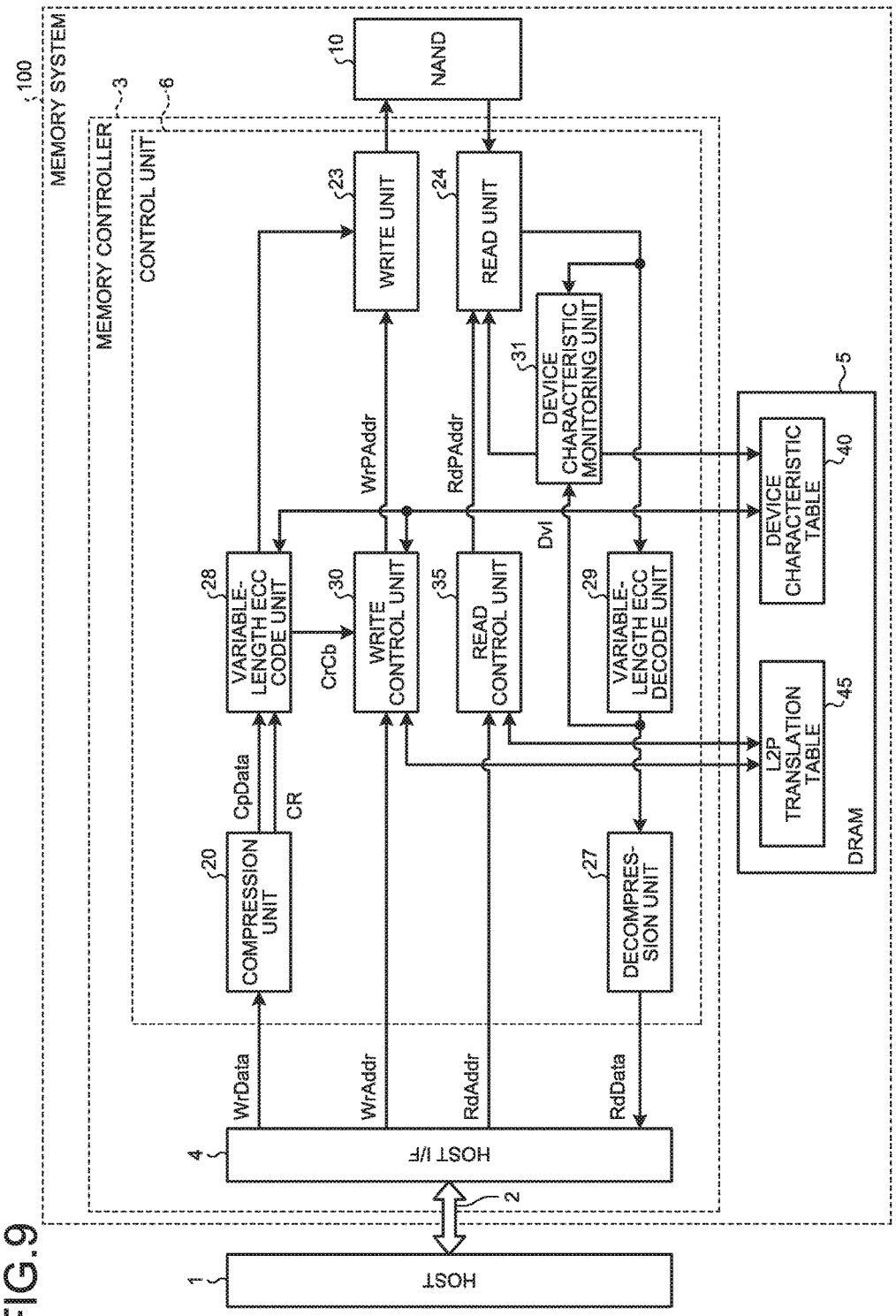
FIG. 9 is a functional block diagram that illustrates an example of the internal configuration of a memory system according to a second embodiment.

FIG. 9 is a functional block diagram that illustrates an example of the internal configuration of a memory system 100 according to a second embodiment. In the memory system 100 according to the second embodiment, the error mitigating code unit 21 and the error mitigating decode unit 26 are removed from the memory system 100 illustrated in FIG. 1, the ECC code unit 22 is replaced with a variable-length ECC code unit 28, and the ECC decode unit 25 is replaced with a variable-length ECC decode unit 29.

In the second embodiment, the variable-length ECC code unit 28 performs coding increasing the number of parity bits by using a data length decreased according to the compression performed by the compression unit 20. In other words, the variable-length ECC code unit 28 allocates a data length decreased according to the compression to an increase in the number of parity bits. The variable-length ECC code unit 28 inputs correction capability information CrCb representing a correction capability to the write control unit 30. As coding having a longer parity length is performed, in other words, as the compression rate CR is higher, the correction capability of the variable-length ECC code unit 28 is higher. For example, the correction capability information CrCb may be classified into a plurality of ranks including at least two ranks. In a case where the correction capability information is classified into three ranks, a lowest rank, a middle rank, and a highest rank are included.

Figure 10:
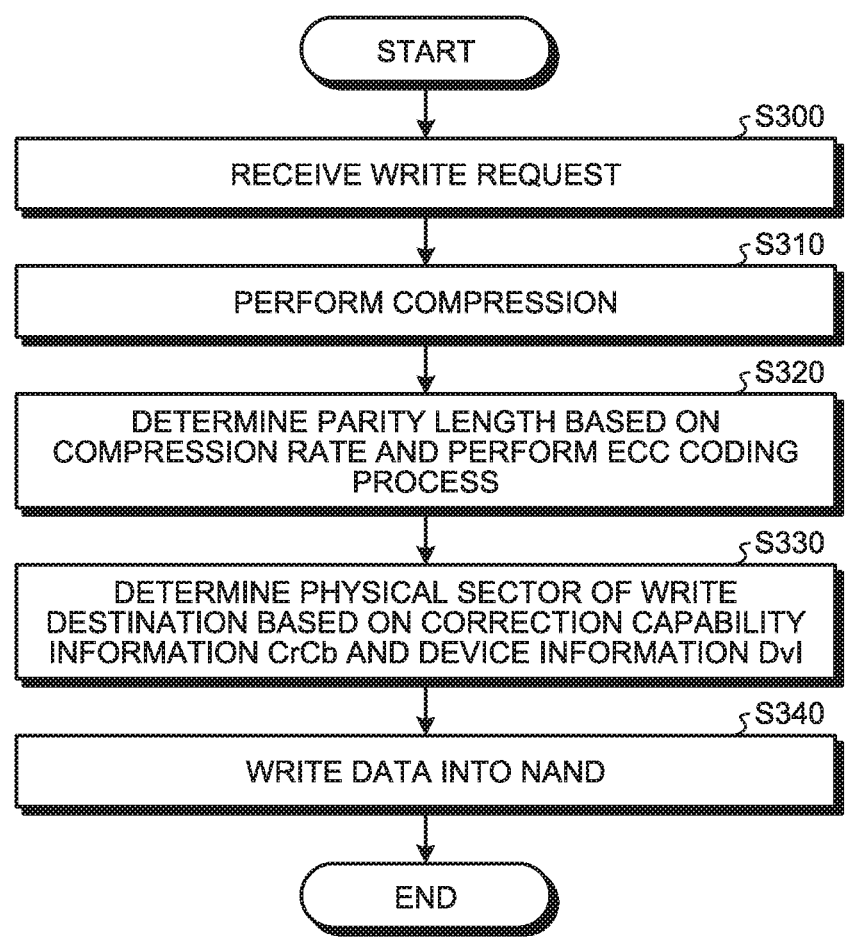
FIG. 10 is a flowchart that illustrates an example of the operation sequence of the memory system according to the second embodiment at the time of data writing.

Hereinafter, the operation sequence of the memory system 100 performed at the time of receiving a write request from the host 1 will be described with reference to a flowchart illustrated in FIG. 10. When a write request is received from the host 1 through the host I/F 4 (S300), the compression unit 20 compresses the write data WrData (S310) and outputs the compression data CpData and the compression rate CR to the variable-length ECC code unit 28. The variable-length ECC code unit 28 determines the number ΔP of parity bits to be increased based on the compression rate CR. The variable-length ECC code unit 28 adds the determined number ΔP of bits to a default number P of bits, thereby determining a parity length (P+ΔP). The variable-length ECC code unit 28 performs an error correction coding process based on the parity length (P+ΔP) (S320). The variable-length ECC code unit 28 inputs a code word including data and parity to the write unit 23. In addition, the variable-length ECC code unit 28 inputs correction capability information CrCb determined based on the compression rate CR to the write control unit 30. The variable-length ECC code unit 28 may add parity length information representing the parity length (P+ΔP) to the code word. Alternatively, the parity length information may be managed using a management table as management information with being associated with a write address WrAddr.

When the translation from the write address WrAddr to the physical address WrPAddr is performed, the write control unit 30 determines a physical address WrPAddr to which the write data WrData is to be written based on the correction capability information CrCb and the device information registered in the device characteristic table 40 (S330). The write control unit 30 selects a plurality of physical sectors as candidates for a write destination based on the device characteristic. In a case where the correction capability information CrCb has a high rank, the write control unit 30 selects a physical sector having the device characteristic of the low rank from among the plurality of selected physical sectors. On the other hand, in a case where the correction capability information CrCb has the low rank, the write control unit 30 selects a physical sector having the device characteristic of the high rank from among the plurality of selected physical sectors. The wrote control unit 30 inputs the determined physical address WrPAddr to the write unit 23 and registers the L2P information in the L2P translation table 45.

The write unit 23 outputs the input code word to the NAND 10 together with the write physical address WrPAddr, thereby writing the code word into the NAND 10 (S340).

Next, the operation sequence of the memory system 100 performed at the time of receiving a read request from the host 1 will be described. When a read request is received from the host 1 through the host I/F 4, the read control unit 35 outputs a physical address RdPAddr into which a read address RdAddr is translated using the L2P table 45 to the read unit 24. The read unit 24 reads a code word from a page of the NAND 10 that corresponds to the physical address RdPAddr. The variable-length ECC decode unit 29 acquires parity length information from the management table or the read code word. The variable-length ECC decode unit 29 performs an error correction decoding process for the read code word based on the parity length information and inputs decoded data (read data) to the decompression unit 27. The decompression unit 27 decompresses the read data and outputs the decompressed read data to the host I/F 4 as read data RdData. The host I/F 4 transmits the read data RdData to the host 1.

In this way, according to the second embodiment, since data having a correction capability that is appropriate to the device characteristic is written into each physical sector, the life and the reliability of the memory system can be improved.

In addition, instead of filling all the bits decreased according to the compression with parity, it may be configured such that a part of a bit length decreased according to the compression is allocated to an increase in the number of parity bits, and the remaining bit length is allocated to the padding data.

In the second embodiment, the code process by the variable-length ECC code unit 28 may be performed in units of pages, and the device characteristic may be managed in units of pages. In this case, when page data for which the variable-length ECC code process has been performed has the correction capability information CrCb of the high rank, the write control unit 30 selects a page having the device characteristic of the low rank from among the plurality of pages as candidates for the write destination. When the page data for which the variable-length ECC code process has been performed has the correction capability information CrCb of the low rank, the write control unit 30 selects a page having the device characteristic of the high rank from among the plurality of pages. Then, the page data for which the variable-length ECC code process has been performed is written to the selected page.

Third Embodiment

Figure 11:
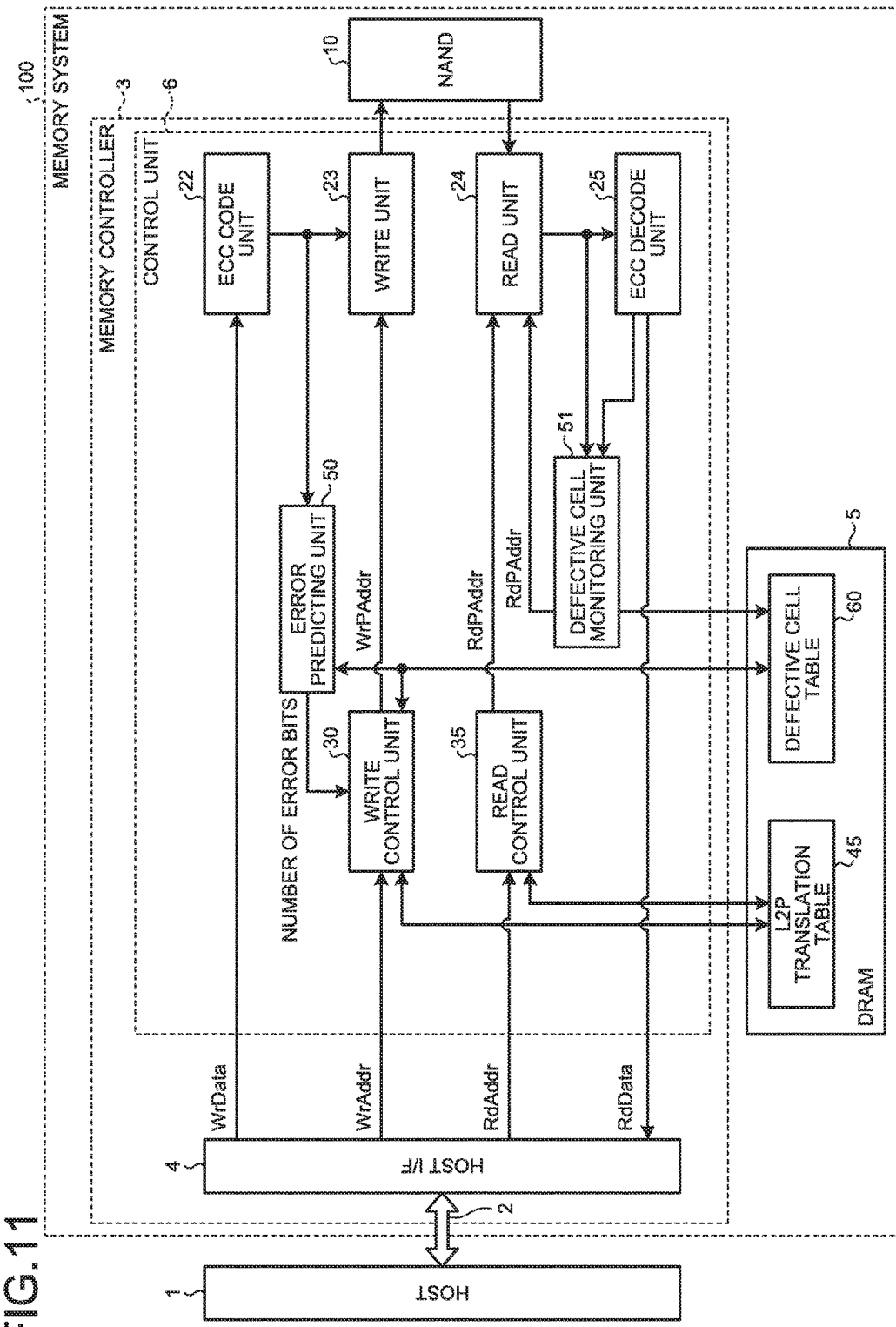
FIG. 11 is a functional block diagram that illustrates an example of the internal configuration of a memory system according to a third embodiment.

FIG. 11 is a block diagram that illustrates an example of the internal configuration of a memory system 100 according to a third embodiment. In the memory system 100 according to the third embodiment, a control unit 6 includes: an ECC code unit 22; a write unit 23; a write control unit 30, a read unit 24; an ECC decode unit 25; a read control unit 35; an error predicting unit 50; and a defective cell monitoring unit 51. In addition, in a DRAM 5, a defective cell table 60 is stored. The defective cell table 60, for example, is backed up in the NAND 10.

The defective cell table 60 includes information relating to a defective cell included in each physical sector. The defective cell information includes position information of a defective cell inside a physical sector and information representing a defection state. The information representing the defection state includes information that is used for identifying whether the defection is "1" fixed, "0" fixed, or unfixed.

The defective cell monitoring unit 51 performs patrol read during a period in which there is no access from the host 1. The patrol read is an operation for testing whether the reliability of data stored in the NAND 10 is damaged according to degradation of memory cells. The defective cell monitoring unit 51 reads data stored in the NAND 10 in a certain unit each time, detects a bit error included in the read data based on a result of decoding performed by the ECC decode unit 25, and acquires the position information of a defective cell inside a physical sector and the information representing a defection state based on a result of the detection. The defective cell monitoring unit 51 registers the position information of a defective cell and the information representing a defection state, which have been acquired, in the defective cell table 60. The defective cell monitoring unit 51 may acquire the information of a defective cell also at the time of reading data based on a read request from the host 1 and register the acquired information in the defective cell table 60. A defective cell of each physical sector is managed by using the defective cell monitoring unit 51 and the defective cell table 60.

The error predicting unit 50, based on a code word coded by the ECC code unit 22 and the defective cell information of a physical sector in which the code word is stored, predicts the number of bit errors of data stored in the physical sector. The error predicting unit 50 performs the prediction for a plurality of physical sectors as write destination candidates. For example, in a case where data "1" is stored in a "1"-fixed defective cell, the error predicting unit 50 determines absence of a bit error. On the other hand, in a case where data "1" is stored in a "0"-fixed defective cell, the error predicting unit 50 determines presence of a bit error. Similarly, in a case where data "0" is stored in a "0"-fixed defective cell, the error predicting unit 50 determines absence of a bit error. On the other hand, in a case where data "0" is stored in a "1"-fixed defective cell, the error predicting unit 50 determines presence of a bit error. The error predicting unit 50 inputs the number of predicted bit errors of each physical sector to the write control unit 30.

The write control unit 30 determines a physical sector having a smallest number of predicted bit errors from among a plurality of physical sectors as a write destination.

Figure 12:
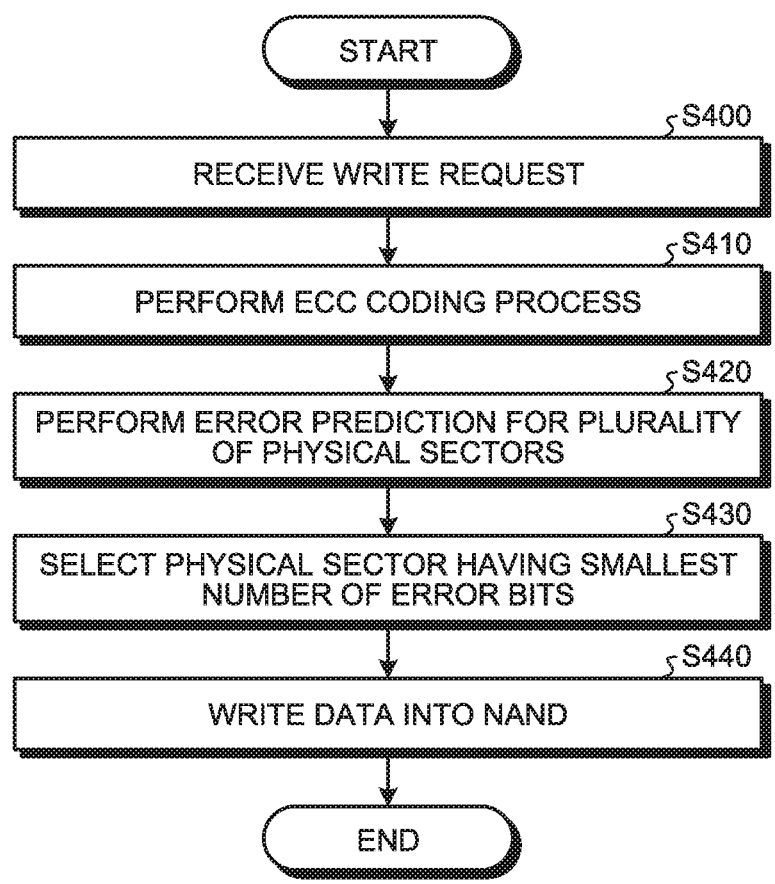
FIG. 12 is a flowchart that illustrates an example of the operation sequence of the memory system according to the third embodiment at the time of data writing.

Hereinafter, the operation sequence of the memory system 100 according to the third embodiment performed at the time of receiving a write request from the host 1 will be described with reference to a flowchart illustrated in FIG. 12. When a write request is received from the host 1 (S400), the ECC code unit 22 codes write data WrData (S410) and inputs a code word to the write unit 23. The write control unit 30 selects a plurality of physical sectors as a write destination of write data. The write control unit 30 reads defective cell information for a plurality of selected physical sectors from the defective cell table 60 and inputs the read defective cell information to the error predicting unit 50. The error predicting unit 50, based on the code word output from the ECC code unit 22 and the defective cell information of a plurality of physical sectors, predicts the number of bit errors for the plurality of physical sectors (S420) and inputs the predicted number of bit errors to the write control unit 30. The write control unit 30 determines a physical sector having a smallest predicted number of bit errors from among the plurality of physical sectors as a write destination (S430). The write control unit 30 inputs the physical address WrPAddr of the determined physical sector to the write unit 23 and registers the L2P information in the L2P translation table 45. The write unit 23 outputs an input code word to the NAND 10 together with the write physical address WrPAddr, thereby writing the code word into the NAND 10 (S440).

Next, the operation sequence of the memory system 100 according to the third embodiment that is performed at the time of receiving a read request from the host 1 will be described. When a read request is received from the host 1 through the host I/F 4, the read control unit 35 outputs a physical address RdPAddr into which a read address RdAddr is translated using the L2P table 45 to the read unit 24. The read unit 24 reads a code word from a page of the NAND 10 that corresponds to the physical address RdPAddr. The ECC decode unit 25 performs an error correction decoding process for the read code word and outputs decoded data (read data) to the host I/F 4 as read data RdData. The host I/F 4 transmits the read data RdData to the host 1.

In this way, according to the third embodiment, since data is written into a physical sector having a smallest number of bit errors among a plurality of physical sectors, the bit error rate is decreased, and the life and the reliability of the memory system can be improved.

In addition, the error predicting unit 50 may perform an error prediction by using the device characteristic table used in the first or second embodiment.

In the third embodiment, the information of the defective cell may be managed in units of pages. In this case, the write control unit 30 determines a page having a smallest number of predicted bit errors from among a plurality of pages as a write destination.

Fourth Embodiment

Figure 13:
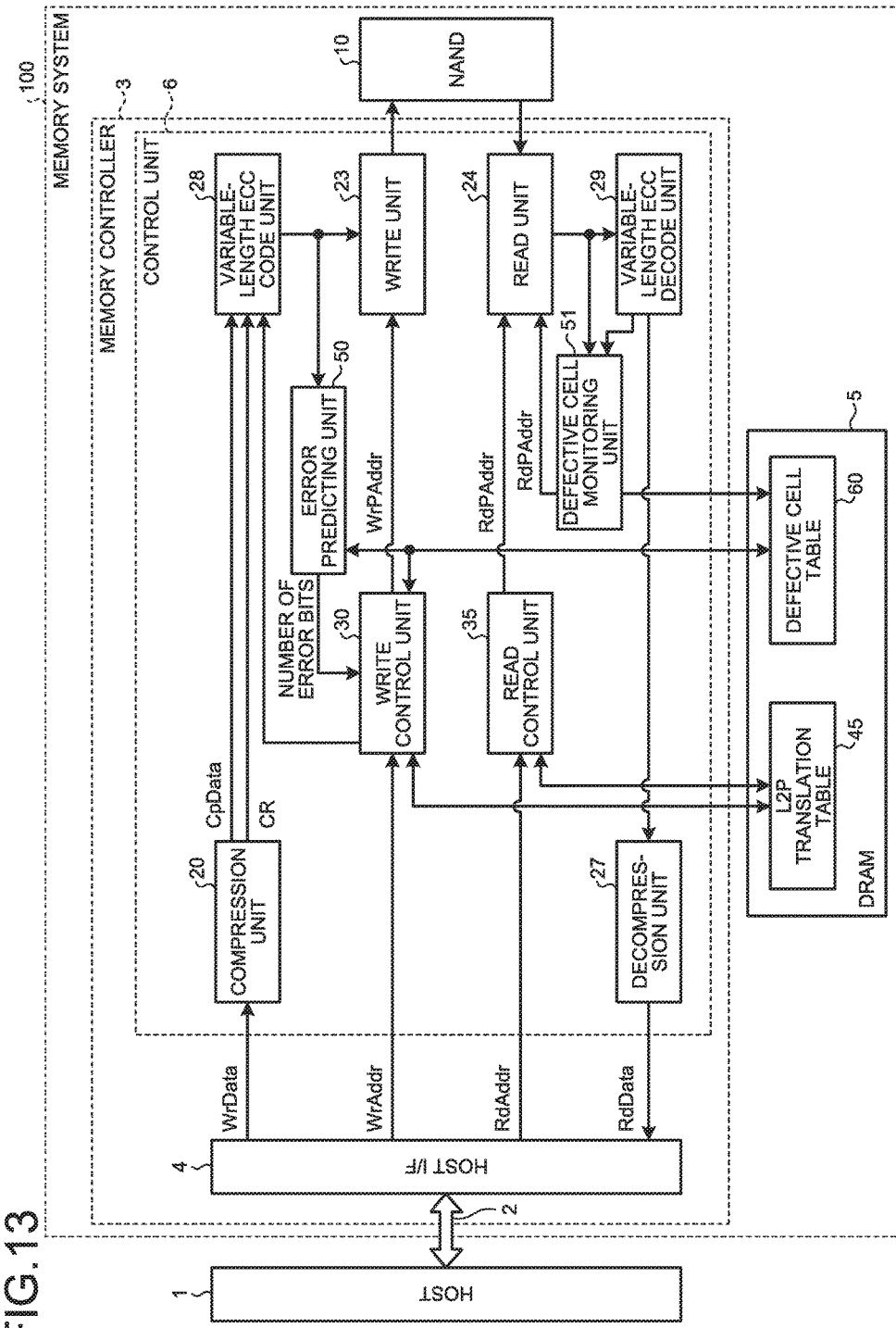
FIG. 13 is a functional block diagram that illustrates an example of the internal configuration of a memory system according to a fourth embodiment.

FIG. 13 is a block diagram that illustrates an example of the configuration of a memory system 100 according to a fourth embodiment. In the memory system 100 according to the fourth embodiment, a compression unit 20 and a decompression unit 27 are added to the memory system 100 illustrated in FIG. 11, the ECC code unit 22 illustrated in FIG. 11 is replaced with a variable-length ECC code unit 28, and the ECC decode unit 25 illustrated in FIG. 11 is replaced with a variable-length ECC decode unit 29. In the fourth embodiment, in a case where the number of bit errors for a physical sector selected as a write destination of data by the process according to the third embodiment is not within an allowed value, the variable-length ECC code unit 28 performs a coding process further increasing a parity length.

Figure 14:
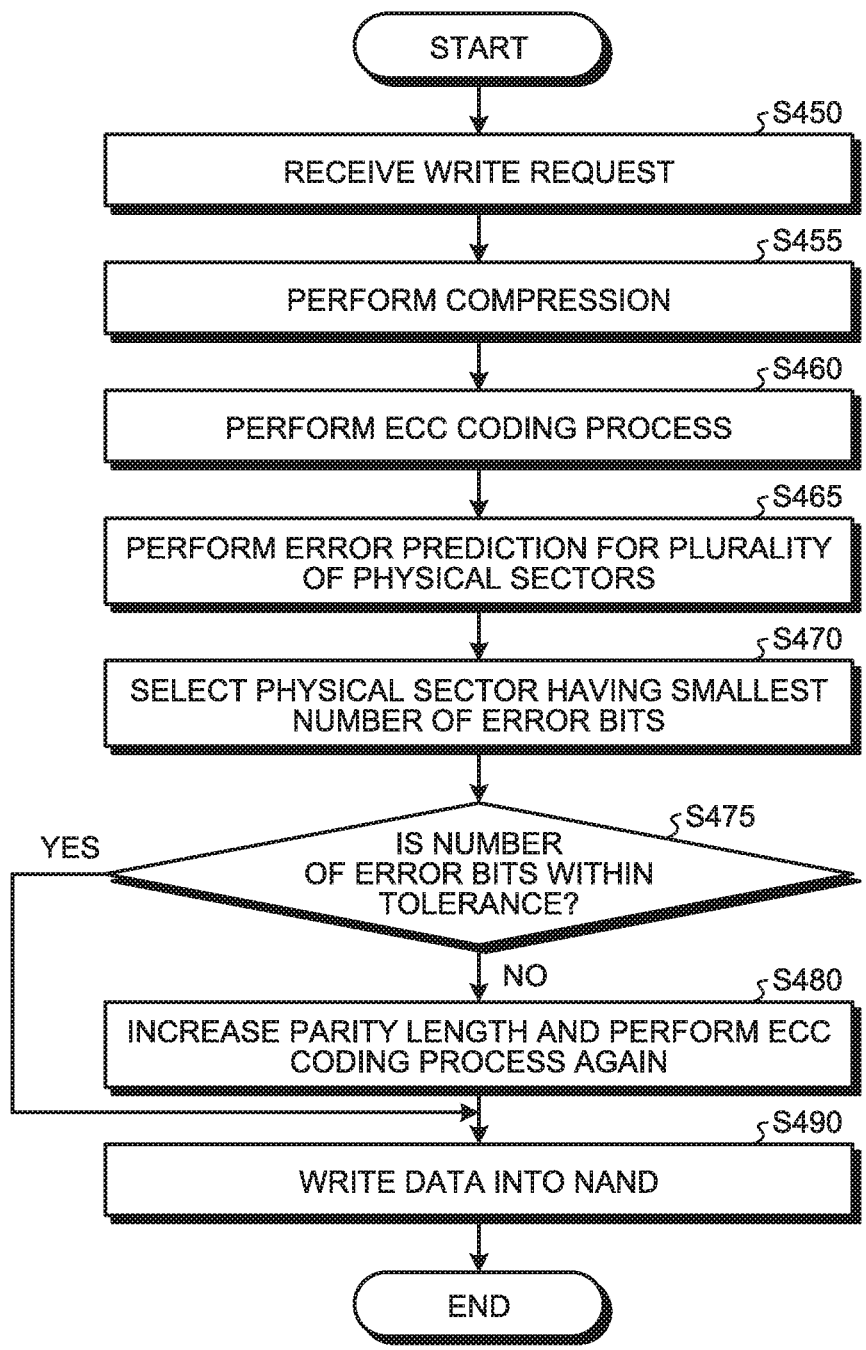
FIG. 14 is a flowchart that illustrates an example of the operation sequence of the memory system according to the fourth embodiment at the time of data writing.

Hereinafter, the operation sequence of the memory system 100 according to the fourth embodiment performed at the time of receiving a write request from the host 1 will be described with reference to a flowchart illustrated in FIG. 14. When a write request is received from the host 1 (S450), the compression unit 20 compresses write data WrData (S455) and outputs compression data CpData and a compression rate CR to the variable-length ECC code unit 28. The variable-length ECC code unit 28 determines the number ΔP of increased parity bits based on the compression rate CR. The variable-length ECC code unit 28 increases the number ΔP of parity bits by using a part of a bit length decreased according to compression. The variable-length ECC code unit 28 adds the increased number ΔP of bits to a default number P of bits, thereby determining a parity length (P+ΔP). The variable-length ECC code unit 28 performs an error correction coding process based on the parity length (P+ΔP) (S460).

The write control unit 30 selects a plurality of physical sectors as a write destination of write data. The write control unit 30 reads defective cell information for a plurality of selected physical sectors from the defective cell table 60 and inputs the read defective cell information to the error predicting unit 50. The error predicting unit 50, based on the code word output from the ECC code unit 22 and the defective cell information of a plurality of physical sectors, predicts the number of bit errors for the plurality of physical sectors (S465) and inputs the predicted number of bit errors to the write control unit 30. The write control unit 30 selects a physical sector having a smallest predicted number of bit errors from among the plurality of physical sectors as a write destination (S470).

The write control unit 30 determines whether or not the predicted number of bit errors for the selected physical sector is within a tolerance (S475). In a case where the predicted number of bit errors is not within the tolerance, the write control unit 30 instructs the variable-length ECC code unit 28 to perform a coding process having a further increased parity length. In response to this instruction, the variable-length ECC code unit 28 performs the coding process having the further increased parity length (S480). On the other hand, in a case where the predicted number of bit errors is within the tolerance, the write control unit 30, for example, instructs the variable-length ECC code unit 28 that recoding is unnecessary. In addition, in a case where the predicted number of bit errors is extremely small, and the predicted number of bit errors is less than a certain threshold, it may be configured such that the parity length is further shortened, and padding data is added to bits that are vacant according to the shortening. Furthermore, the variable-length ECC code unit 28 may add parity length information to the code word. Alternatively, the parity length information may be associated with the write address WrAddr so as to be managed by a management table as management information.

The write control unit 30 inputs the physical address WrPAddr of the selected physical sector to the write unit 23 and registers the L2P information in the L2P translation table 45. The write unit 23 outputs an input code word to the NAND 10 together with the write physical address WrPAddr, thereby writing the code word into the NAND 10 (S490).

Next, the operation sequence of the memory system 100 according to the fourth embodiment, that is performed at the time of receiving a read request from the host 1 will be described. When a read request is received from the host 1 through the host I/F 4, the read control unit 35 outputs a physical address RdPAddr into which a read address RdAddr is translated using the L2P table 45 to the read unit 24. The read unit 24 reads a code word from a page of the NAND 10 that corresponds to the physical address RdPAddr. The variable-length ECC decode unit 29 acquires parity length information from the management table or the read code words. The variable-length ECC decode unit 29 performs an error correction decoding process for the read code word based on the acquired parity length information and inputs decoded data (read data) to the decompression unit 27. The decompression unit 27 decompresses the read data and outputs the decompressed data to the host I/F 4 as read data RdData. The host I/F 4 transmits the read data RdData to the host 1.

In this way, according to the fourth embodiment, since data is written into a physical sector having a smallest number of bit errors among a plurality of physical sectors, the bit error rate is decreased. In addition, in a case where the predicted number of bit errors is not within the allowed value, coding having an increased parity length is re-performed, and accordingly, the bit error rate is further decreased, and the life and the reliability of the memory system can be improved.

In the fourth embodiment, data may be written into a page having a smallest number of bit errors among a plurality of pages.

Fifth Embodiment

Figure 15:
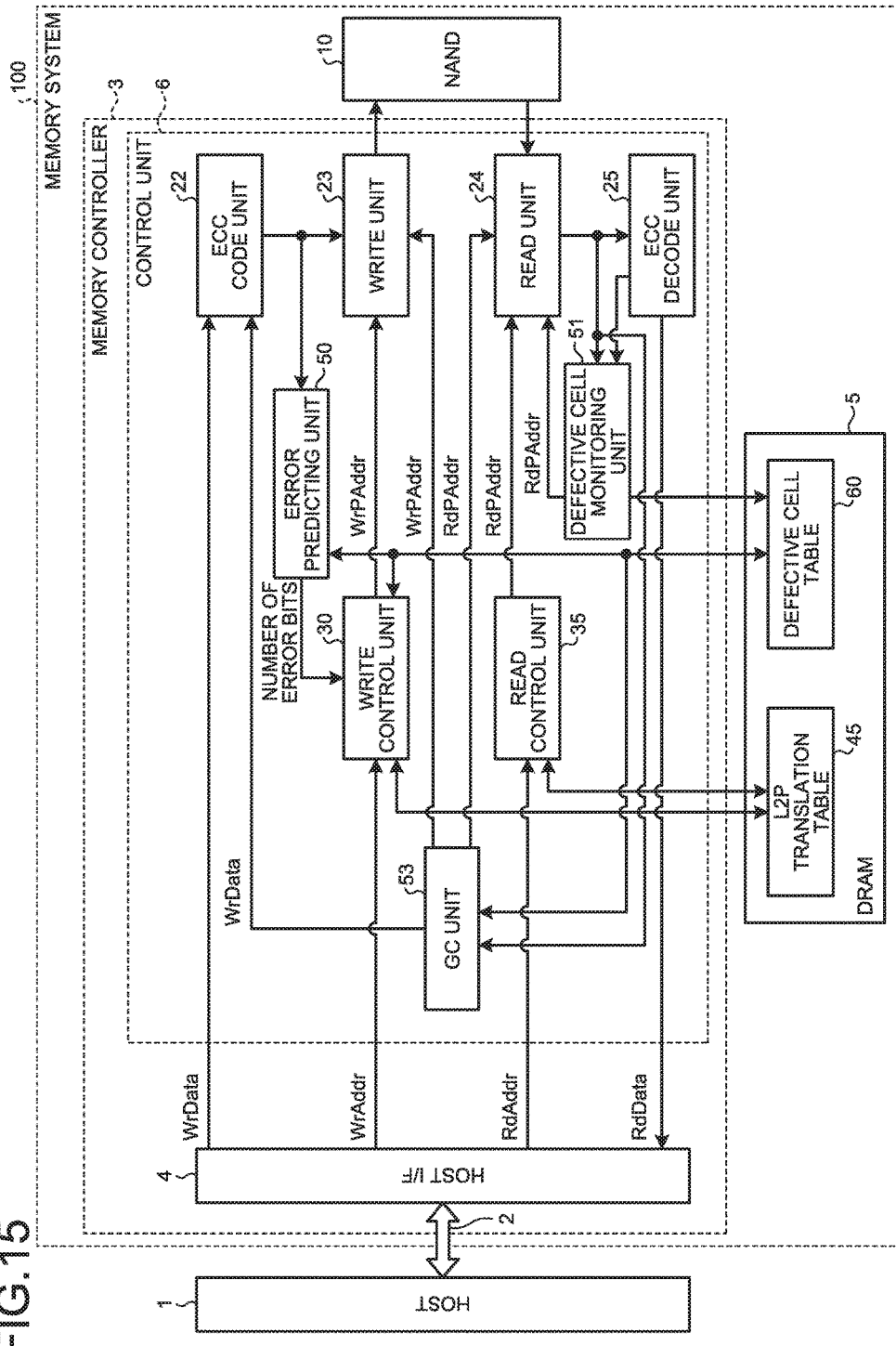
FIG. 15 is a functional block diagram that illustrates an example of the internal configuration of a memory system according to a fifth embodiment.

FIG. 15 is a block diagram that illustrates an example of the configuration of a memory system 100 according to a fifth embodiment. In the memory system 100 according to the fifth embodiment, a garbage collection unit (GC unit) 53 is added to the memory system 100 illustrated in FIG. 11.

In the memory system 100, in a case where the data erase unit (block) and the data read/write unit are different from each other, when rewriting for the NAND 10 progresses, a block is fragmented according to invalid data. In a case where the number of such fragmented blocks is increased, the number of usable blocks is decreased. Thus, for example, in a case where the number of free blocks of the NAND 10 is less than a certain threshold, garbage collection (compaction) is performed, and thus, the number of free blocks is increased. In the garbage collection (hereinafter, abbreviated to GC), the valid data is collected from a block including valid data and invalid data and is rewritten into another block.

The GC unit 53, based on the defective cell information of the defective cell table 60, performs GC in which a block configured by physical sectors having a small number of defective cells is selected as a GC source block with priority. For example, in a case where two blocks are present as candidates for a GC source block, the number of defective cells included in a physical sectors, in which GC target data is stored, included in one of the blocks and the number of defective cells included in a physical sector s, in which GC target data is stored, included in the other of the blocks are compared with each other, and a block having a smaller number of defective cells is selected.

Figure 16:
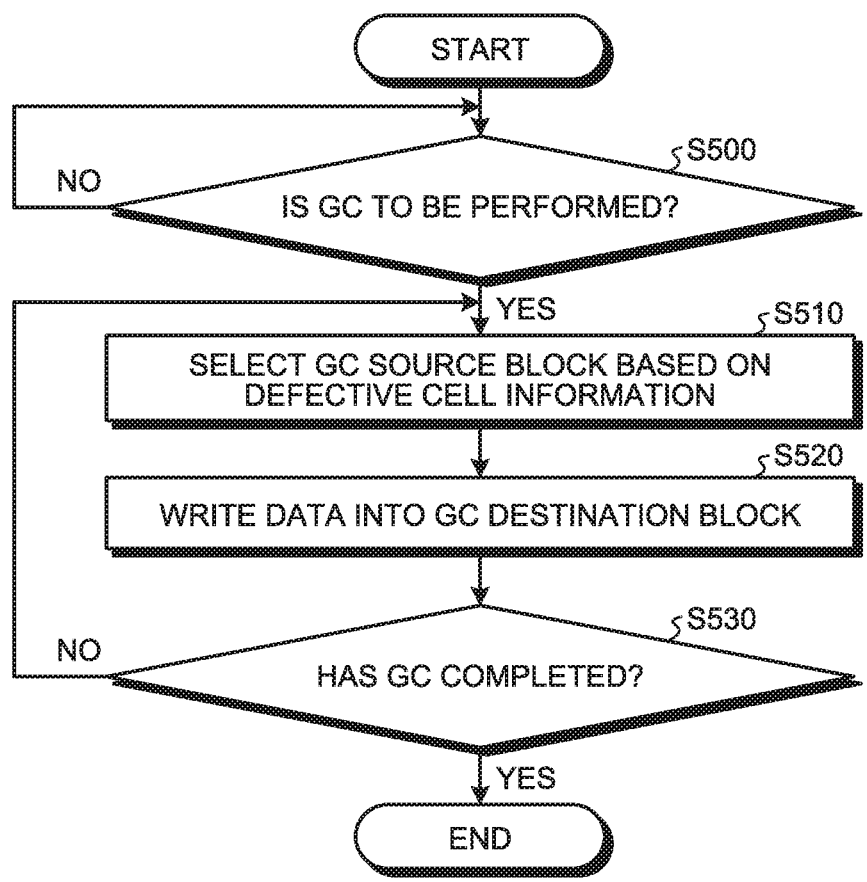
FIG. 16 is a flowchart that illustrates an example of the operation sequence of the memory system according to the fifth embodiment at the time of performing garbage collection.

Hereinafter, an example of the operation of the memory system 100 according to the fifth embodiment will be described with reference to a flowchart illustrated in FIG. 16. For example, in a case where a GC execution condition such as a condition in which the number of free blocks is less than a certain threshold is satisfied (S500), the GC unit 53 searches for candidates for a GC source block that is a GC target. The GC unit 53 selects a block having a smaller number of defective cells from among a plurality of candidate blocks with priority based on the defective cell information (S510). The GC unit 53 inputs a read address RdAddr of the selected GC source block to the read unit 24 and reads data of the GC target from the NAND 10. The GC unit 53 inputs a write address WrAddr included in a GC destination block in which read data of the GC target is to be stored to the write unit 23. In addition, the GC unit 53 inputs the read data of the GC target to the ECC code unit 22 as write data WrData. Accordingly, the data of the GC target is written into the GC destination block of the NAND 10 (S520). The GC unit 53 determines whether or not the GC has been completed (S530) and, in a case where the GC has not been completed, performs such a process until the GC is completed.

In this way, according to the fifth embodiment, a block having a smaller number of defective cells is selected with priority as a GC source block, and GC is performed. For this reason, a block having a small number of defective cells transits to a free block with priority. Accordingly, the bit error can be decreased.

In addition, the GC unit 53 may be configured to select a GC source block having a small number of bit errors by referring to the device characteristic table used in the first or second embodiment. Furthermore, the GC unit 53 may be added to the memory system illustrated in FIG. 1 or the memory system illustrated in FIG. 9.

Sixth Embodiment

Figure 17:
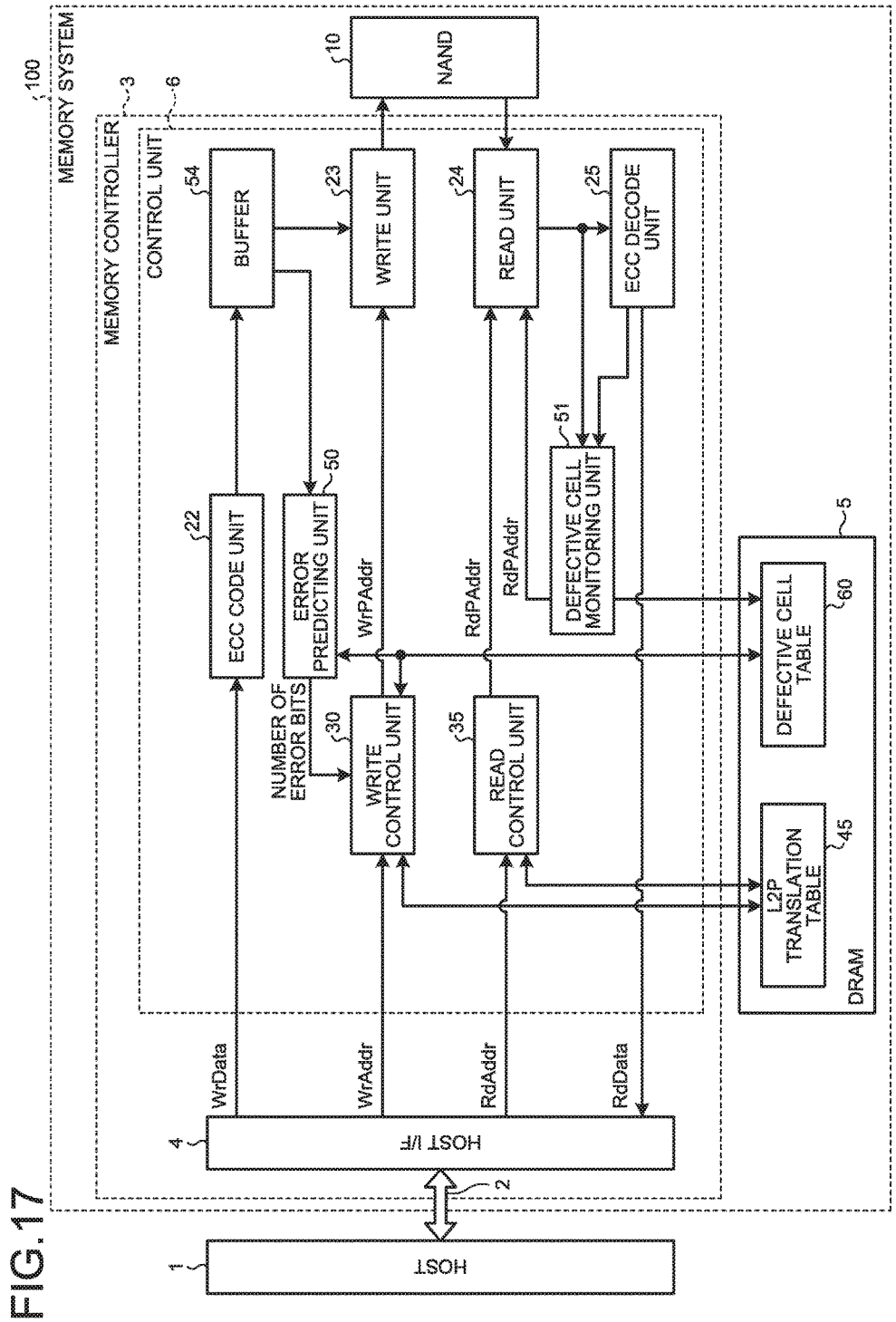
FIG. 17 is a functional block diagram that illustrates an example of the internal configuration of a memory system according to a sixth embodiment.

FIG. 17 is a block diagram that illustrates an example of the configuration of a memory system 100 according to a sixth embodiment. In the memory system 100 according to the sixth embodiment, a buffer 54 is added to the memory system 100 illustrated in FIG. 11. The buffer 54 can buffer code words corresponding to a plurality of pages that are coded by the ECC code unit 22. An error predicting unit 50 simultaneously performs error predictions of code words corresponding to the plurality of pages (q pages) buffered in the buffer 54. For example, the error predicting unit 50, based on code words of one page and defective cell information of a plurality of (r) physical sectors, predicts the number of bit errors for each of a plurality of physical sectors and inputs the predicted number of bit errors of each physical sector to the write control unit 30. The error predicting unit 50 performs this error predicting process for code words of q pages. The write control unit comprehensively determines (q×r) predicted numbers of bit errors and selects write destinations of code words of q pages from among r physical sectors. For example, the write control unit determines write destinations of code words of q pages from among r physical sectors such that the number of bit errors of code words of each of q pages is minimal.

For example, a plurality of pieces of WL data written into a plurality of physical sectors adjacent in the direction of a bit line intersecting word lines are buffered in the buffer 54. In the buffer 54, code words of q pages are buffered. In addition, as a plurality of physical sectors referring to the defective cell information, r physical sectors adjacent in the direction of the bit line are selected. By selecting write destinations of code words of q pages from among r physical sectors by the process performed by the error predicting unit 50 and write control unit 30 such that the number of bit errors of code words of q pages is minimal, an error due to an inter-cell interference between word lines can be suppressed.

In this way, according to the sixth embodiment, based on error predictions, write destinations of code words of a plurality of pages are selected from among a plurality of physical sectors such that the number of bit errors of code words of a plurality of pages is minimal. For this reason, the bit error rate is further decreased, and the life and the reliability of the memory system can be improved.

Seventh Embodiment

Figure 18:
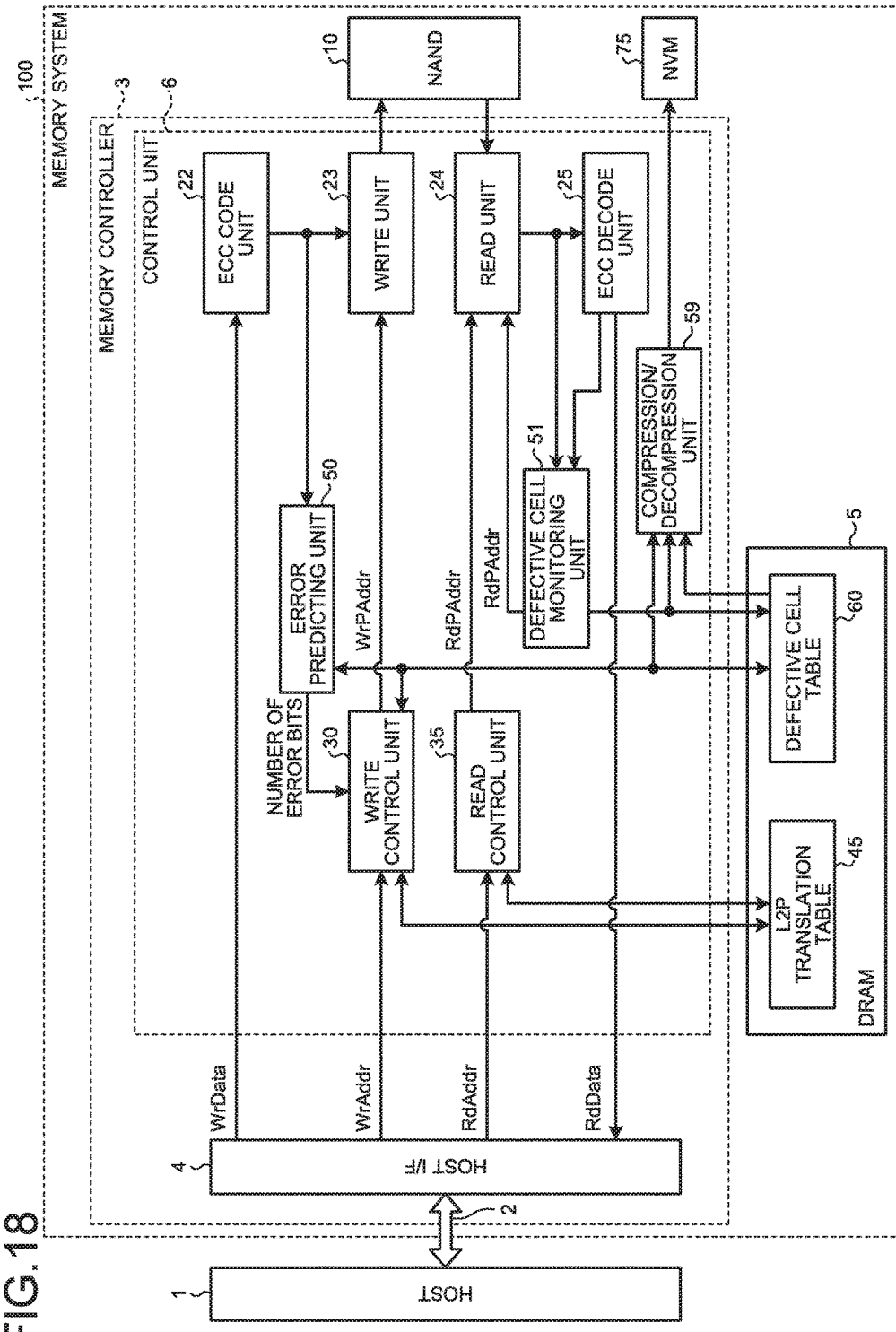
FIG. 18 is a functional block diagram that illustrates an example of the internal configuration of a memory system according to a seventh embodiment.

FIG. 18 is a block diagram that illustrates an example of the configuration of a memory system 100 according to a seventh embodiment. In the memory system 100 according to the seventh embodiment, a compression/decompression unit 59 and an NVM 75 are added to the memory system 100 illustrated in FIG. 11. The NVM 75 is a nonvolatile memory used for backing up the defective cell table 60 loaded into the DRAM 5. In addition, the defective cell table 60 stored in the DRAM 5 may be backed up in the NAND 10.

The compression/decompression unit 59 compresses the defective cell information acquired by the defective cell monitoring unit 51 and stores the compressed defective cell information in the NVM 75. The compression/decompression unit 59 reads only defective cell information of a part or physical sectors selected as write destination candidates from the NVM 75 based on information supplied from the write control unit 30, decompresses the read defective cell information, and stores the decompressed defective cell information in the DRAM 5 as the defective cell table 60.

In this way, according to the seventh embodiment, since a part of the defective cell information stored in the NVM 75 is loaded into the DRAM 5, the DRAM capacity required for maintaining the defective cell information can be decreased. In addition, it may be configured such that the compression/decompression unit 59 and the NVM 75 are arranged in the memory system illustrated in FIG. 1, the device characteristic table 40 is compressed/decompressed by the compression/decompression unit 59, and the device characteristic table 40 is backed up in the NVM 75. Similarly, it may be configured such that the compression/decompression unit 59 and the NVM 75 are arranged in the memory system illustrated in FIG. 9, the device characteristic table 40 is compressed/decompressed by the compression/decompression unit 59, and the device characteristic table 40 is backed up in the NVM 75.

Eighth Embodiment

Figure 19:
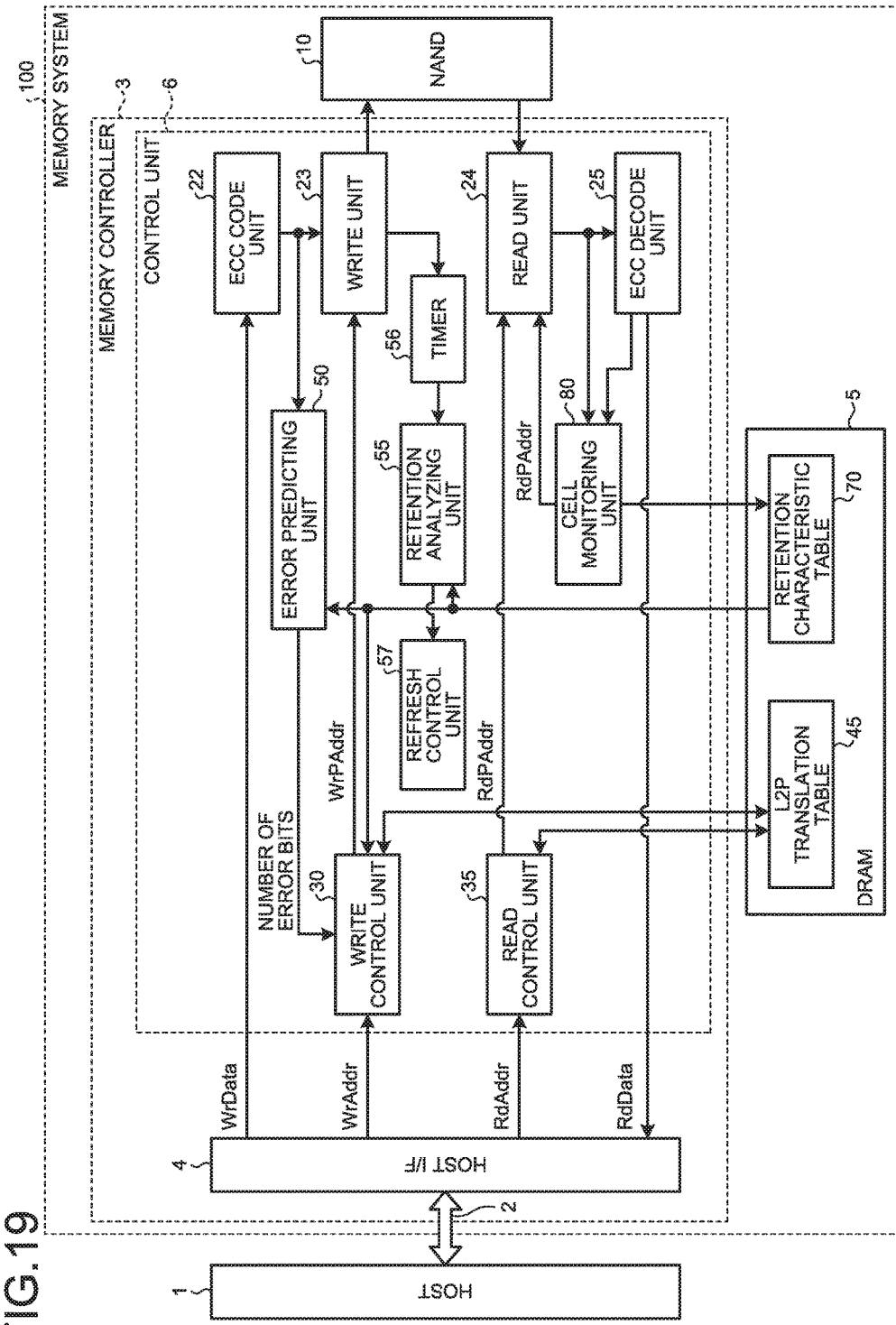
FIG. 19 is a functional block diagram that illustrates an example of the internal configuration of a memory system according to an eighth embodiment.

FIG. 19 is a block diagram that illustrates an example of the configuration of a memory system 100 according to an eight embodiment. In the memory system 100 according to the eighth embodiment, a retention analyzing unit 55, a timer 56, and a refresh control unit 57 are added to the memory system 100 illustrated in FIG. 11. In addition, the defective cell table 60 of the memory system 100 illustrated in FIG. 11 is replaced with a retention characteristic table 70, and the defective cell monitoring unit 58 is replaced with a cell monitoring unit 80. For the convenience of description, signal lines for data and addresses relating to the refresh control unit 57 are not illustrated.

In the retention characteristic table 70, a retention characteristic of each physical sector is registered. As the retention characteristic, a maintaining time in which a certain amount of electric charge can be maintained from a time point when data is written into a physical sector is set.

The cell monitoring unit 80, during a period in which there is no access from the host 1, regularly reads all the data stored in the NAND 10 in a certain unit each time, measures a threshold voltage of each cell or a sample cells included in a physical sector, determines a status in which electric charge of each cell drops, and measures the retention characteristic of each cell based on this determination. The cell monitoring unit 80, for example, registers an average of retention characteristics or a shortest retention characteristic of cells in the retention table 70. Alternatively, the cell monitoring unit 80 may be configured to detect a bit error included in read data based on a result of decoding performed by the ECC decode unit 25, measure an occurrence rate of bit errors included in a physical sector based on a result of the detection, and measure the retention characteristic of the physical sector based on a result of the measurement. In addition, the cell monitoring unit 80 may be configured to measure the retention characteristic by using data read based on a read request from the host 1.

The timer 56 measures an elapsed time from a time point when data is written into each physical sector for each physical sector. The retention analyzing unit 55 compares the retention characteristic of each physical sector with the elapsed time of each physical sector. For example, in a case where a physical sector having an elapsed time coinciding with the retention characteristic occurs, the retention analyzing unit 55 indicates a refresh start instruction and a physical sector for which refresh is performed to the refresh control unit 57. When the refresh start instruction is received, the refresh control unit 57 performs a refresh process in which data of the indicated physical sector is moved to another physical sector.

The error predicting unit 50, based on a code word coded by the ECC code unit 22 and the retention characteristics of a plurality of physical sectors, predicts the number of bit errors for the plurality of physical sectors and inputs the predicted number of bit errors to the write control unit 30. The write control unit 30 selects a physical sector having a smallest predicted number of bit errors from among the plurality of physical sectors as a write destination.

Hereinafter, the operation sequence of the memory system 100 according to the eighth embodiment performed at the time of receiving a write request from the host 1 will be described. When a write request is received from the host 1, the ECC code unit 22 performs an error correction coding process. The write control unit 30 selects a plurality of physical sectors as candidates for a write destination of write data. The write control unit 30 reads the retention characteristics of the plurality of selected physical sectors from the retention characteristic table 70 and inputs the read retention characteristics to the error predicting unit 50. The error predicting unit 50 inputs the predicted numbers of bit errors to the write control unit 30 based on a code word and the retention characteristics. The write control unit 30 selects each physical sector of which the number of bit errors is within the allowed value from among the plurality of physical sectors. The write control unit 30 selects a physical sector of which the number of bit errors is largest from among the selected physical sectors of which the numbers of bit errors are within the allowed value as a write destination. On the other hand, in a case where the number of bit errors of each physical sector is not within the allowed value, the write control unit 30 selects a physical sector of which the predicted number of bit errors is smallest from among the plurality of physical sectors as a write destination.

The write control unit 30 inputs the physical address WrPAddr of the physical sector selected as the write destination to the write unit 23 and registers the L2P information in the L2P translation table 45. The write unit 23 outputs an input code word to the NAND 10 together with the write physical address WrPAddr, thereby writing the code word into the NAND 10.

Next, the operation sequence of the memory system 100 according to the eighth embodiment that is performed at the time of receiving a read request from the host 1 will be described. When a read request is received from the host 1 through the host I/F 4, the read control unit 35 outputs a physical address RdPAddr into which a read address RdAddr is translated using the L2P table 45 to the read unit 24. The read unit 24 reads a code word from a page of the NAND 10 that corresponds to the physical address RdPAddr. The ECC decode unit 25 performs an error correction decoding process for the read code word and outputs decoded data (read data) to the host I/F 4 as read data RdData. The host I/F 4 transmits the read data RdData to the host 1.

In this way, according to the eighth embodiment, since a physical sector having a smallest number of bit errors is determined based on the retention characteristics of physical sectors, and data is written into a physical sector of which the number of bit errors is smallest among a plurality of physical sectors, the bit error rate is decreased. In addition, in a case where the numbers of bit errors are within the allowed value, a physical sector of which the number of bit errors is the largest among physical sectors of which the numbers of bit errors are within the allowed value is selected as a write destination, and accordingly, the use frequencies of the physical sectors are leveled. Furthermore, since the refresh start period is determined based on the retention characteristic of each physical sector, the life and the reliability of the memory system can be improved.

Ninth Embodiment

Figure 20:
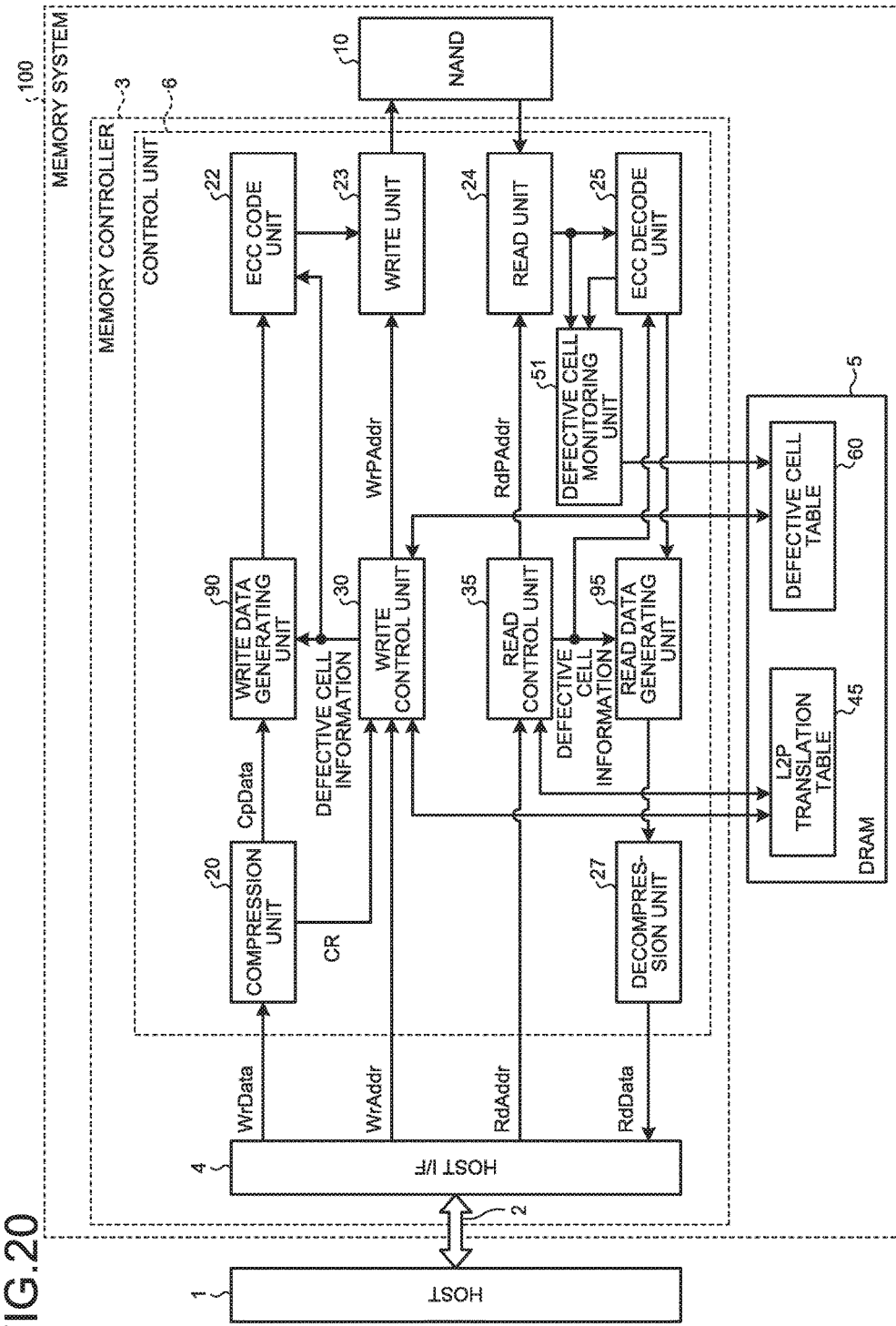
FIG. 20 is a functional block diagram that illustrates an example of the internal configuration of a memory system according to a ninth embodiment.

FIG. 20 is a block diagram that illustrates an example of the configuration of a memory system 100 according to a ninth embodiment. In the memory system 100 according to the ninth embodiment, the error mitigating code unit 21 of the memory system 100 illustrated in FIG. 1 is replaced with a write data generating unit 90, and the error mitigating decode unit 26 is replaced with a read data generating unit 95. In addition, the defective cell monitoring unit 51 described above is added to the memory system 100 illustrated in FIG. 1, and the device characteristic table 40 is replaced with the defective cell table described above.

The defective cell monitoring unit 51, during a period in which there is no access from the host 1, reads data stored in the NAND 10 in a certain unit each time, detects a bit error included in the read data based on a result of decoding performed by the ECC decode unit 25, and acquires the position information of a defective cell inside a physical sector based on a result of the detection. The defective cell monitoring unit 51 registers the acquired position information of the defective cell in the defective cell table 60.

The write control unit 30, based on the compression rate CR and the defective cell table 60, selects a physical sector in which write data WrData is to be written from among a plurality of candidates. The write control unit 30 calculates the size of a writable area for each of a plurality of physical sectors as a write destination candidate for the write data WrData based on the defective cell information. The size of the writable area can be acquired based on subtraction of the number of bits of defective cells and the parity length acquired by the ECC code unit 22 from the size of the physical sector. The write control unit 30 calculates the sizes of writable areas of a plurality of physical sectors and determines a write destination of the write data WrData based on a plurality of the sizes and the compression rate CR. For example, in the following example, for the simplification, the parity length is not considered. In a case where data of which the compression rate is 60% is written into one of a physical sector including defective cells of 40% and a physical sector including defective cells of 20%, the physical sector including the defective cells of 40% is selected.

The write control unit 30 inputs the defective cell information of the determined physical sector to the write data generating unit 90 and the ECC code unit 22. The write data generating unit 90 performs a defective cell avoiding process for the compression data CpData based on the defective cell information. The defective cell avoiding process is a process of generating data for being written into a physical sector by avoiding a defective cell. As the defective cell avoiding process, for example, there is a skip process. In the skip process, based on the defective cell information, in the compression data CpData, as data of a bit position of which the write destination corresponds to a defective cell, an arbitrary value (for example, "1") is output in place of data of the bit position included in the compression data CpData, and, after the output of the arbitrary value, the data of the bit position included in the compression data CpData is output. Such a skip process is performed at bit positions corresponding to all the defective cells.

The ECC code unit 22, based on the defective cell information, performs coding such that parity is generated with data of a bit position corresponding to a defective cell ignored.

The read control unit 35 acquires the defective cell information of the physical sector in which the read data is stored from the defective cell table 60 and inputs the acquired defective cell information to the read data generating unit 95 and the ECC decode unit 25. The ECC decode unit 25, based on the defective cell information, performs decoding with a bit position corresponding to a defective cell ignored.

The read data generating unit 95, based on the defective cell information, removes data of the bit position corresponding to the defective cell from the read data decoded by the ECC decode unit 25, thereby acquiring the original compression data CpData.

Hereinafter, the operation sequence of the memory system 100 according to the ninth embodiment performed at the time of receiving a write request from the host 1 will be described. When a write request is received from the host 1, the compression unit 20 compresses write data WrData corresponding to one page, outputs the compression data CpData to the write data generating unit 90, and outputs the compression rate CR to the write control unit 30. The write control unit 30, based on the compression rate CR and the defective cell table 60, selects a physical sector in which the write data WrData is to be written from a plurality of candidates. The write control unit 30 inputs the defective cell information of the determined physical sector to the write data generating unit 90 and the ECC code unit 22. The write data generating unit 90, based on the defective cell information, performs a defective cell avoiding process of generating data for being written into a physical sector with a defective memory cell avoided for the compression data CpData. The ECC code unit 22, based on the defective cell information, performs coding with data of a bit position corresponding to a defective cell ignored. The write unit 23 outputs an input code word to the NAND 10 together with the write physical address WrPAddr, thereby writing the code word into the NAND 10.

Next, the operation sequence of the memory system 100 according to the ninth embodiment that is performed at the time of receiving a read request from the host 1 will be described. When a read request is received from the host 1 through the host I/F 4, the read control unit 35 outputs a physical address RdPAddr into which a read address RdAddr is translated using the L2P table 45 to the read unit 24. The read unit 24 reads a code word from a page of the NAND 10 that corresponds to the physical address RdPAddr. The ECC decode unit 25, based on the defective cell information, performs a decoding process in which a bit position corresponding to the defective cell is ignored. The read data generating unit 95, based on the defective cell information, removes data of a bit position corresponding to the defective cell from the read data decoded by the ECC decode unit 25, thereby acquiring the original compression data CpData. The decompression unit 27 decompresses the read data and outputs the decompressed read data to the host I/F 4 as read data RdData. The host I/F 4 transmits the read data RdData to the host 1.

In this way, according to the ninth embodiment, a write destination is determined based on the compression rate and the defective cell information of each physical sector. For this reason, also for a physical page in which a defective cell is present, the memory system can be effectively used and contributes to the acquisition of the capacity and the prolonged life of the memory system. In addition, since data is written with a defective cell avoided, the improvement of the error rate can be expected.

In the ninth embodiment, the position information of the defective cell in the defective cell table 60 may be managed in units of pages. In this case, the write control unit 30, based on the compression rate CR and the defective cell table 60, selects a page in which the write data WrData is to be written from a plurality of candidate pages.

In the first to ninth embodiments described above, while a threshold voltage distribution of four values has been illustrated, the first to ninth embodiments described above may be applied to a memory having a threshold voltage distribution of two values, eight values, 16 values, or more. In addition, as the data coding of a multi-value memory cell, while one kind of data coding relating to the four values has been illustrated, the first to ninth embodiments described above may be applied to any other arbitrary data coding.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes is the form of the embodiments described herein may be made without departing from the spirit of the inventions. The accompanying claims and their equivalents are intended to cover such forms or modifications as would fall within the scope and spirit of the inventions.

What is claimed is:

1. A memory controller that controls a nonvolatile memory including a plurality of physical sectors, each of the plurality of physical sectors including memory cells, the memory controller comprising:
   a compression unit that compresses first data;
   a data translating unit that performs a first data translation for the compressed first data, and calculates first information based on second data, the second data being a result of the first data translation;
   a control unit that determines a first physical sector in which the second data is to be written among the plurality of physical sectors based on the first information and device characteristics of the plurality of the physical sectors; and
   a write unit that writes the second data into the first physical sector of the nonvolatile memory, wherein, in a case where the first information includes capability information of a first rank, the control unit allocates a physical sector having a device characteristic of a second rank to the first physical sector, and in a case where the first information includes the capability information of a third rank, the control unit allocates a physical sector having a device characteristic of a fourth rank to the first physical sector, the capability information having the first rank and the third rank, the device characteristic having the second rank and the fourth rank, the first rank being higher rank than the third rank, the second rank being lower rank than the fourth rank.

2. The memory controller according to claim 1, wherein the device characteristic includes information representing degrees of wear of the physical sectors or information representing retention characteristics of the physical sectors.

3. The memory controller according to claim 1,
wherein the first data translation is a padding process that includes adding, to the compressed first data, a number of pieces of padding data corresponding to a compression rate of the compressed first data, and wherein the data translating unit inputs, to the control unit, the first information determined based on the compression rate of the compressed first data and the second data.

4. The memory controller according to claim 1,
wherein the first data translation is a logical operation process that includes performing a certain logical operation for the compressed first data and adding identification information representing an execution content of the logical operation to the compressed first data, and wherein the data translating unit inputs, to the control unit, the first information determined based on the second data.

5. The memory controller according to claim 4, wherein the logical operation is performed in first management units, the identification information is added in correspondence with data of the first management unit, and the first management unit is controlled to have a different size according to a compression rate of the compressed first data, the first management unit having a certain length acquired by dividing the physical sector into a plurality of parts, and wherein the data translating unit inputs, to the control unit, the first information determined based on the compression rate of the compressed first data and the second data.

6. The memory controller according to claim 1, further comprising a garbage collection processing unit that performs a garbage collection including reading data from a first block of the nonvolatile memory and writing the read data into a second block of the nonvolatile memory, wherein the garbage collection processing unit selects the first block based on the device characteristics of the physical sectors.

7. The memory controller according to claim 1, further comprising
a device characteristic managing unit that manages device characteristics of the physical sectors, and a compression/decompression unit that compresses the device characteristics managed by the device characteristic managing unit and stores the compressed device characteristics in a volatile first memory and decompresses a part of the device characteristics stored in the volatile first memory and loads the decompressed device characteristic into the device characteristic managing unit.

8. The memory controller according to claim 1, further comprising a device characteristic managing unit that manages device characteristics of the physical sectors, wherein the device characteristic managing unit manages the device characteristics of the physical sectors by using a second memory, and the device characteristic managing unit calculates the device characteristics of the physical sectors based on data read from the nonvolatile memory and updates the device characteristics managed by the second memory with the calculated device characteristics of the physical sectors.

9. A memory controller that controls a nonvolatile memory including a plurality of physical sectors, each of the plurality of physical sectors including memory cells, the memory controller comprising:

a compression unit that compresses first data;

a data translating unit that performs a first data translation for the compressed first data, the first data translation being a variable-length error correction code process, the variable-length error correction code process including adding, to the compressed first data, parity having a different parity length according to a compression rate of the compressed first data;

a control unit that determines a first physical sector in which second data is to be written among the plurality of physical sectors based on first information and device characteristics of the plurality of the physical sectors, the second data being a result of the first data translation, the first information being acquired based on the compression rate of the compressed first data; and a write unit that writes the second data into the first physical sector of the nonvolatile memory, wherein, in a case where the first information includes capability information of a first rank, the control unit allocates a physical sector having a device characteristic of a second rank to the first physical sector, and in a case where the first information includes the capability information of a third rank, the control unit allocates a physical sector having a device characteristic of a fourth rank to the first physical sector, the capability information having the first rank and the third rank, the device characteristic having the second rank and the fourth rank, the first rank being higher rank than the third rank, the second rank being lower rank than the fourth rank.

10. The memory controller according to claim 9, wherein the device characteristic includes information representing degrees of wear of the physical sectors or information representing retention characteristics of the physical sectors.

11. A memory controller that controls a nonvolatile memory including a plurality of physical sectors, each of the plurality of physical sectors including memory cells, the memory controller comprising:

an error predicting unit that predicts a number of bit errors occurring when first data is stored in the plurality of the physical sectors based on the first data to be written into the nonvolatile memory and defective cell information of the plurality of the physical sectors, the defective cell information at least including position information of a defective cell;

a control unit that determines a first physical sector in which the first data is to be written among the plurality of the physical sectors based on the predicted number of bit errors; and a write unit that writes the first data into the first physical sector of the nonvolatile memory.

12. The memory controller according to claim 11, wherein the control unit determines a physical sector of which the predicted number of bit errors is minimal as the first physical sector.

13. The memory controller according to claim 11, further comprising:
a compression unit that compresses the first data; and
a code unit that adds parity of a different parity length in accordance with a compression rate of the compressed first data to the compressed first data,
wherein the error predicting unit predicts a numbers of bit errors occurring when coded first data is stored in the plurality of the physical sectors based on the first data coded by the code unit and the defective cell information of the plurality of the physical sectors, and
wherein the control unit determines a first physical sector in which the first data is to be written among the plurality of the physical sectors based on the predicted numbers of bit errors.

14. The memory controller according to claim 11, further comprising a retention managing unit that manages retention characteristics of the physical sectors,
wherein the error predicting unit predicts a numbers of bit errors occurring when third data is stored in the plurality of the physical sectors based on the third data to be written into the nonvolatile memory and the retention characteristics of the plurality of the physical sectors, and
wherein the control unit determines a second physical sector in which the third data is to be written among the plurality of the physical sectors based on the predicted numbers of bit errors,
wherein the write unit writes the third data into the second physical sector of the nonvolatile memory.

15. The memory controller according to claim 14, further comprising a refresh control unit that measures an elapsed time from when the third data is written into the second physical sector and determines timing for moving the third data written into the second physical sector to another physical sector based on a comparison between the measured elapsed time and the retention characteristic of the second physical sector.

16. The memory controller according to claim 11, further comprising a buffer that stores a plurality of pieces of the first data,
wherein the error predicting unit predicts a numbers of bit errors occurring when the plurality of pieces of the first data are to be stored in the plurality of the physical sectors based on the plurality of pieces of the first data stored in the buffer and the defective cell information of the plurality of the physical sectors, and
wherein the control unit determines a plurality of first physical sectors in which the plurality of pieces of the first data are to be written among the plurality of the physical sectors based on the predicted numbers of bit errors.

17. The memory controller according to claim 11, further comprising a garbage collection processing unit that performs a garbage collection including reading data from a first block of the nonvolatile memory and writing the read data into a second block of the nonvolatile memory,
wherein the garbage collection processing unit selects the first block based on the defective cell information of the physical sectors.

18. The memory controller according to claim 11, further comprising
a defective cell managing unit that manages the defective cell information of the physical sectors,
a compression/decompression unit that compresses the defective cell information managed by the defective cell managing unit and stores the compressed defective cell information of the physical sectors in a nonvolatile first memory and decompresses a part of the defective cell information stored in the first memory and loads the decompressed defective cell information into the defective cell managing unit.

* * * * *